(12) United States Patent
Yesil et al.

(10) Patent No.: US 12,463,630 B2
(45) Date of Patent: Nov. 4, 2025

(54) VOLTAGE BOOSTED TRANSMITTER WITHOUT A NEGATIVE RAIL

(71) Applicant: QUALCOMM Incorporated, San Diego, CA (US)

(72) Inventors: Ercem Yesil, San Diego, CA (US); Patrick Isakanian, El Dorado Hills, CA (US); Kevin Jia-Nong Wang, Poway, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 57 days.

(21) Appl. No.: 18/402,568

(22) Filed: Jan. 2, 2024

(65) Prior Publication Data

US 2025/0219631 A1 Jul. 3, 2025

(51) Int. Cl.
*H03K 17/0412* (2006.01)
*H03K 17/06* (2006.01)
*H03K 17/687* (2006.01)

(52) U.S. Cl.
CPC ..... *H03K 17/04123* (2013.01); *H03K 17/063* (2013.01); *H03K 17/687* (2013.01); *H03K 2217/0081* (2013.01)

(58) Field of Classification Search
CPC ........... H03K 17/04123; H03K 17/063; H03K 17/687; H03K 2217/0081; H03K 17/0412; H03K 17/06; H03K 19/01714; H03K 19/01; H03K 19/017; H03K 19/01721; H03K 19/01735; H03K 19/01707; H02M 3/071; H02M 3/072; H02M 3/076

See application file for complete search history.

(56) References Cited

U.S. PATENT DOCUMENTS

| 6,259,310 B1 * | 7/2001 | Kawamura | H02M 3/073 327/536 |
|---|---|---|---|
| 9,589,627 B1 | 3/2017 | Wilson et al. | |
| 11,121,713 B1 | 9/2021 | Bardsley et al. | |

OTHER PUBLICATIONS

International Search Report and Written Opinion—PCT/US2024/056134—ISA/EPO—Mar. 10, 2025.
Tan S.C., et al., "Low Power CMOS Level Shifters by Bootstrapping Technique", Electronics Letters, the Institution of Engineering and Technology, GB, vol. 38, No. 16, Aug. 1, 2002, pp. 876-878, XP006018630, 2 Pages, figure 2.

\* cited by examiner

*Primary Examiner* — Jung Kim
(74) *Attorney, Agent, or Firm* — Loza & Loza, LLP

(57) ABSTRACT

A system includes a driver including a pull-up p-type field effect transistor (PFET). The system also includes a negative boost circuit. The negative boost circuit includes a first drive circuit configured to receive a first supply voltage, a second drive circuit configured to receive a second supply voltage different from the first supply voltage, a switch coupled between an output of the second drive circuit and a gate of the pull-up PFET, and a capacitor having a first terminal and a second terminal, wherein the first terminal is coupled to the gate of the pull-up PFET and the second terminal is coupled to an output of the first drive circuit. The system also includes a pre-drive circuit configured to drive an input of the first drive circuit and an input of the second drive circuit based on an input signal.

20 Claims, 14 Drawing Sheets

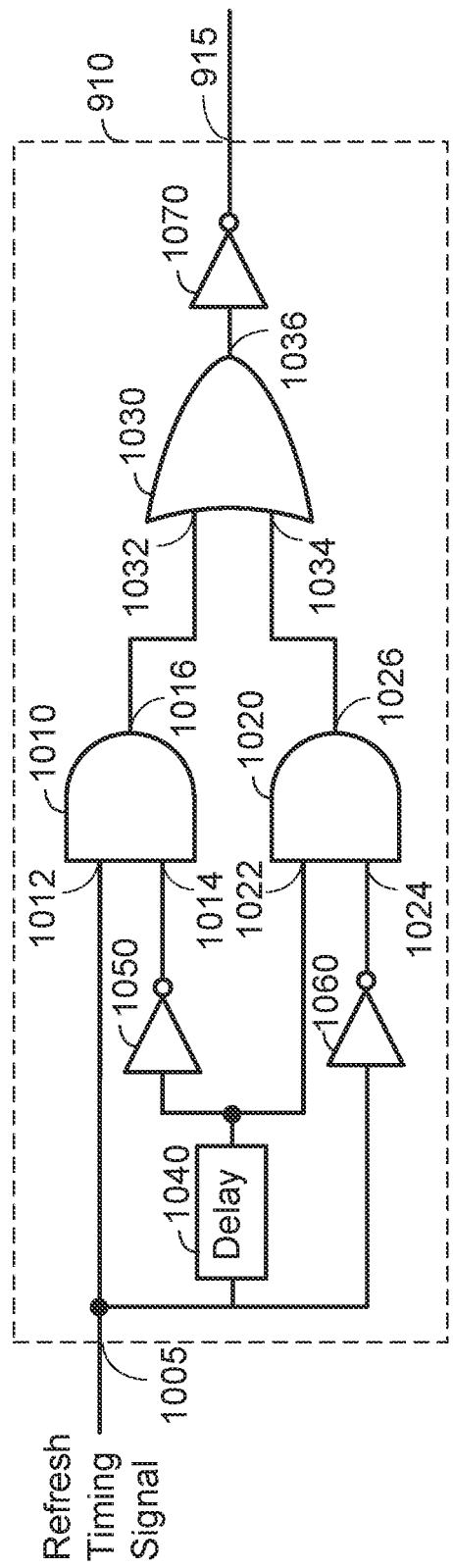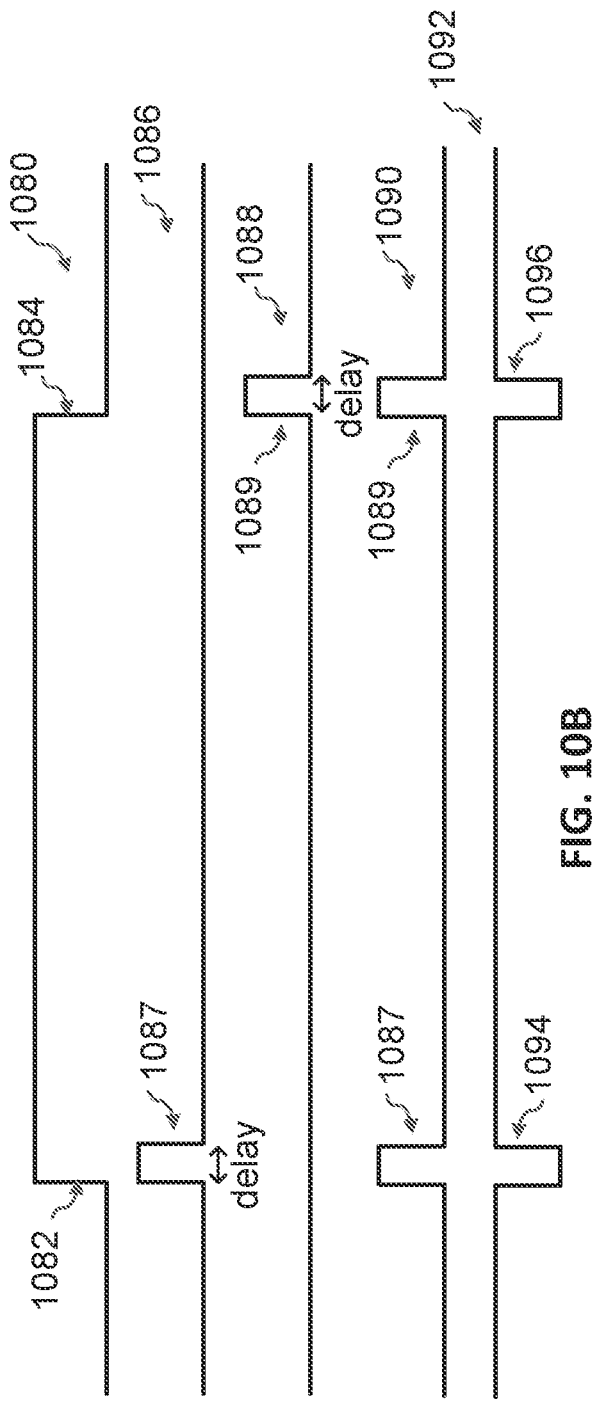
FIG. 10A
FIG. 10B

US 12,463,630 B2

VOLTAGE BOOSTED TRANSMITTER WITHOUT A NEGATIVE RAIL

BACKGROUND

Field

Aspects of the present disclosure relate generally to transmitters, and more particularly, to a transmitter with a negative voltage boost using a capacitor.

Background

A transmitter may be used to transmit a signal from a first circuit to a second circuit via a link between the first circuit and the second circuit. The transmitter may include a driver configured to drive the link high or low based on the logic value of an input signal (e.g., an input data signal). The driver typically includes a pull-down device for driving the link low (e.g., to a ground potential) and a pull-up device for driving the link high (e.g., to a supply voltage). The pull-device may include an n-type field effect transistor (NFET), a p-type field effect transistor (PFET), or both.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a driver including a pull-up p-type field effect transistor (PFET). The system also includes a negative boost circuit. The negative boost circuit includes a first drive circuit configured to receive a first supply voltage, a second drive circuit configured to receive a second supply voltage different from the first supply voltage, a switch coupled between an output of the second drive circuit and a gate of the pull-up PFET, and a capacitor having a first terminal and a second terminal, wherein the first terminal is coupled to the gate of the pull-up PFET and the second terminal is coupled to an output of the first drive circuit. The system also includes a pre-drive circuit configured to drive an input of the first drive circuit and an input of the second drive circuit based on an input signal.

A second aspect relates to a system. The system includes a driver including a pull-up p-type field effect transistor (PFET). The system also includes a negative boost circuit. The negative boost circuit includes a first drive circuit configured to receive a first supply voltage, a second drive circuit configured to receive a second supply voltage different from the first supply voltage, a third drive circuit configured to receive the second supply voltage, a capacitor having a first terminal and a second terminal, wherein the first terminal is coupled to a gate of the pull-up PFET, a first switch coupled between an output of the second drive circuit and the gate of the pull-up PFET, a second switch coupled between an output of the first drive circuit and the second terminal of the capacitor, and a third switch coupled between an output of the third drive circuit and the second terminal of the capacitor. The system also includes a pre-drive circuit configured to drive an input of the first drive circuit, an input of the second drive circuit, and an input of the third drive circuit based on an input signal.

BRIEF DESCRIPTION OF THE DRAWINGS

FIG. 10A shows an exemplary implementation of the refresh circuit according to certain aspects of the present disclosure.

FIG. 10B is a timing diagram of exemplary signals in the refresh circuit of FIG. 10A according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
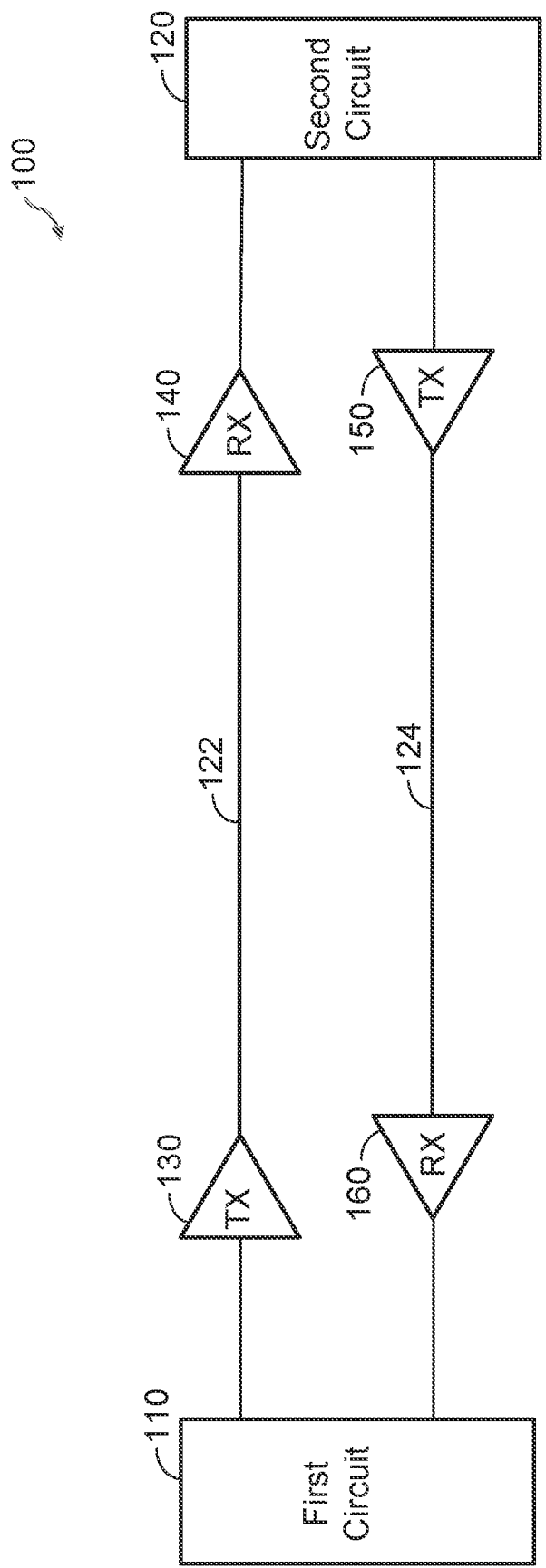
FIG. 1A shows an example of a system including transmitters and receivers for facilitating communication between a first circuit and a second circuit according to certain aspects of the present disclosure.

FIG. 1A shows an example of a system 100 including a first circuit 110, a second circuit 120, a first transmitter 130, a first receiver 140, a first link 122, a second transmitter 150, a second receiver 160, and a second link 124. The first link 122 is coupled between the output of the first transmitter 130 and the input of the first receiver 140, and the second link 124 is coupled between the output of the second transmitter 150 and the input of the second receiver 160. Each of the first link 122 and the second link 124 may be a serial link or another type of link.

In the example in FIG. 1A, the first circuit 110 is coupled to the input of the first transmitter 130 and the output of the second receiver 160, and the second circuit 120 is coupled to the output of the first receiver 140 and the input of the second transmitter 150. The first circuit 110 may include a processor, a memory controller, a modem, or another type of circuit. The second circuit 120 may include a memory (e.g., low-power double data rate (LPDDR) memory), a processor, a transceiver, or another type of circuit.

In operation, the first transmitter 130 receives a signal from the first circuit 110, and drives the first link 122 with the signal to transmit the signal to the first receiver 140 via the first link 122. The first receiver 140 receives the signal via the first link 122 and outputs the received signal to the second circuit 120 for further processing. The first receiver 140 may be configured to amplify the received signal and/or perform equalization on the received signal (e.g., to correct for distortion in the received signal caused by frequency-dependent attenuation in the first link 122). In this example, the first transmitter 130, the first link 122, and the first receiver 140 support communication from the first circuit 110 to the second circuit 120.

In operation, the second transmitter 150 receives a signal from the second circuit 120, and drives the second link 124 with the signal to transmit the signal to the second receiver 160 via the second link 124. The second receiver 160 receives the signal via the second link 124 and outputs the received signal to the first circuit 110 for further processing. The second receiver 160 may be configured to amplify the received signal and/or perform equalization on the received signal. In this example, the second transmitter 150, the second link 124, and the second receiver 160 support communication from the second circuit 120 to the first circuit 110.

Thus, in this example, the transmitters 130 and 150, the links 122 and 124, and the receivers 140 and 160 facilitate bidirectional communication between the first circuit 110 and the second circuit 120. It is to be appreciated that the system 100 may include additional links, additional transmitters, and additional receivers in addition to the links 122 and 124, the transmitters 130 and 150, and the receivers 140 and 160 shown in FIG. 1A (e.g., to support communication between the first circuit 110 and the second circuit 120 over multiple parallel channels).

Figure 1B:
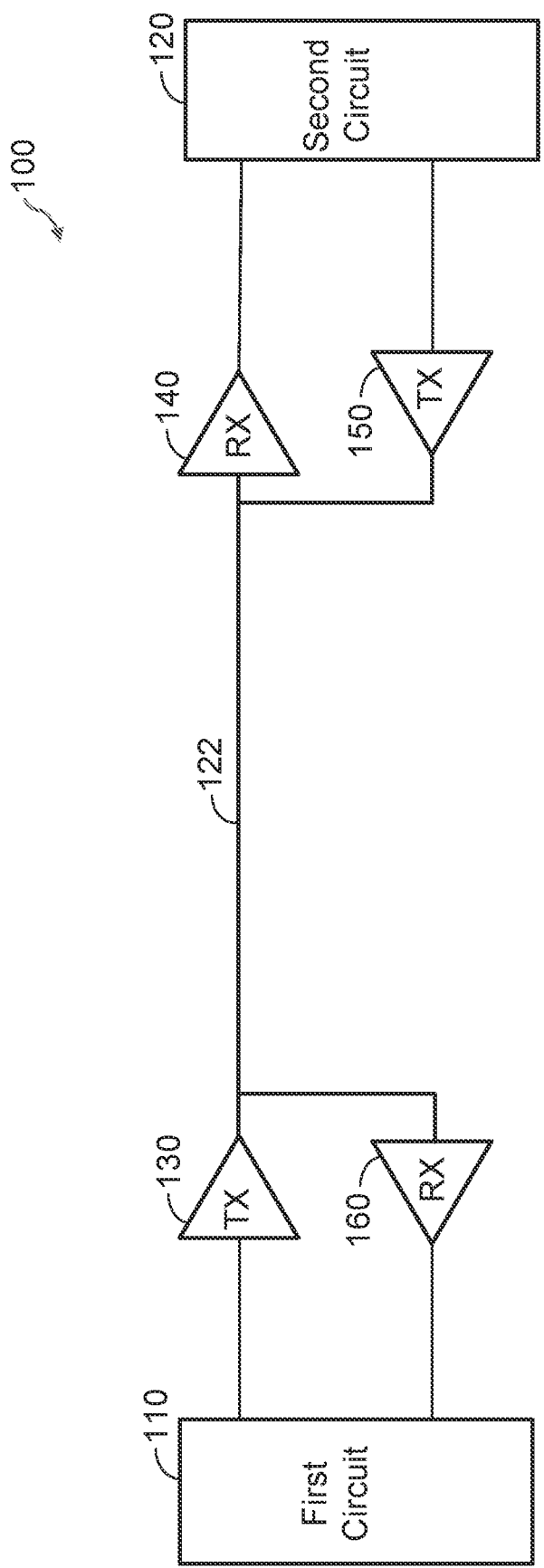
FIG. 1B shows an example in which the transmitters and the receivers of FIG. 1A share a link according to certain aspects of the present disclosure.

It is to be appreciated that communication in both directions may be carried on a shared link instead of two separate links in some implementations. In this regard, FIG. 1B shows an example in which the second transmitter 150 and the second receiver 160 share the first link 122 with the first transmitter 130 and the first receiver 140. In this example, the first link 122 is coupled between the output of the second transmitter 150 and the input of the second receiver 160 in addition to being coupled between the output of the first transmitter 130 and the input of the first receiver 140. In this example, the first transmitter 130 and the second transmitter 150 may transmit signals over the shared link (i.e., the first link 122) one at a time.

Figure 2A:
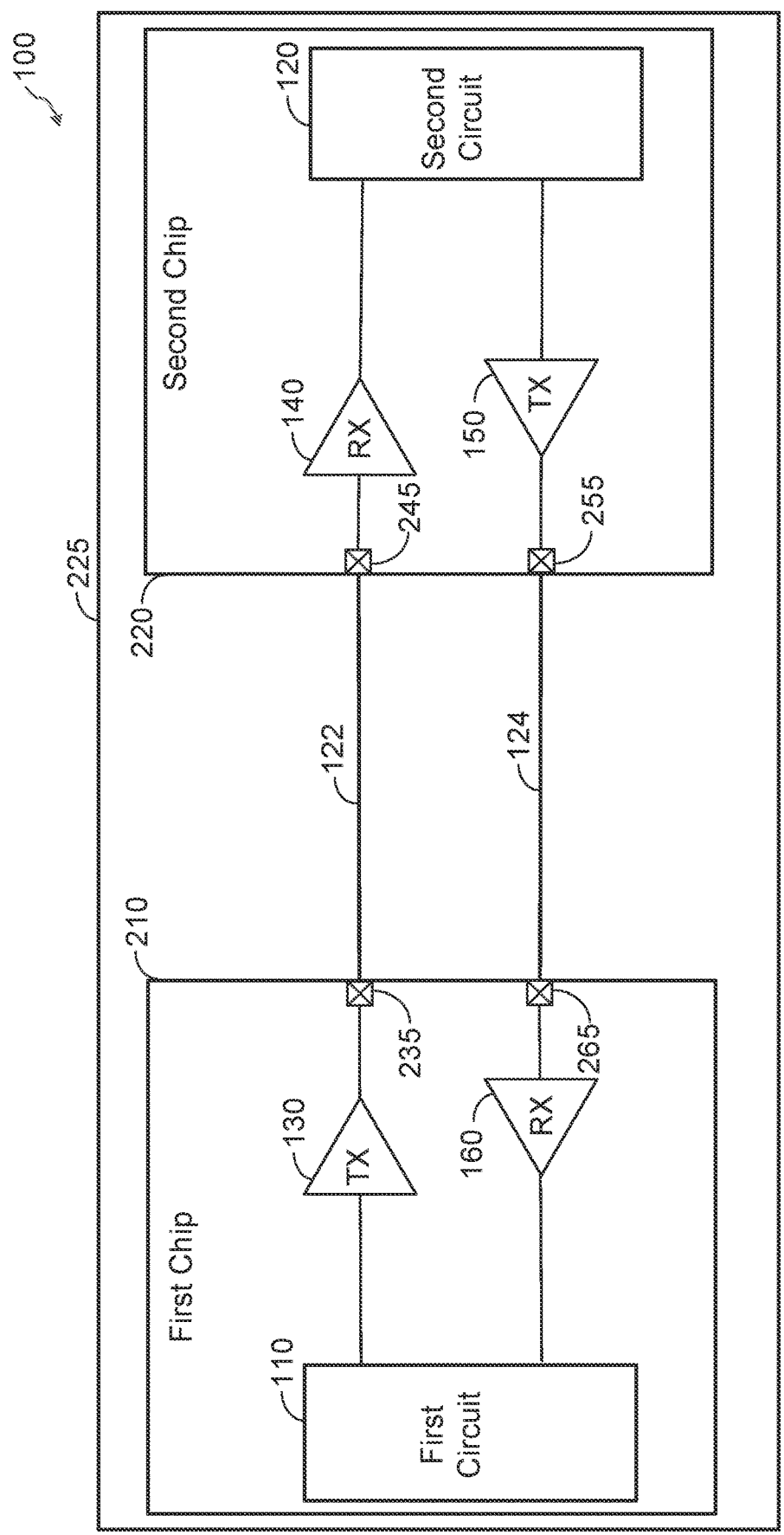
FIG. 2A shows an example in which the transmitters and the receivers are integrated on chips according to certain aspects of the present disclosure.

FIG. 2A shows an example in which the system 100 includes a first chip 210 and a second chip 220. In this example, the first transmitter 130, the second receiver 160, and the first circuit 110 are integrated on the first chip 210, and the first receiver 140, the second transmitter 150, and the second circuit 120 are integrated on the second chip 220. The first chip 210 and the second chip 220 may be mounted on a substrate 225 (e.g., a printed circuit board (PCB), a multi-layer laminate, a package substrate, or the like), as shown in the example in FIG. 2A. However, it is to be appreciated that this need not be the case. Each of the links 122 and 124 may be implemented with one or more metal traces on and/or embedded in the substrate 225, a cable, or another type of link.

In the example shown in FIG. 2A, the first chip 210 includes a first pad 235 coupled to the output of the first transmitter 130, and a second pad 265 coupled to the input of the second receiver 160. Also, the second chip 220 includes a first pad 245 coupled to the input of the first receiver 140, and a second pad 255 coupled to the output of the second transmitter 150. In this example, the first link 122 is coupled between the first pad 235 on the first chip 210 and the first pad 245 on the second chip 220, and the second link 124 is coupled between the second pad 265 on the first chip 210 and the second pad 255 on the second chip 220. Thus, in this example, the first link 122 and the second link 124 facilitate chip-to-chip communication between the first chip 210 and the second chip 220. However, it is to be appreciated that the present disclosure not limited to this example.

Figure 2B:
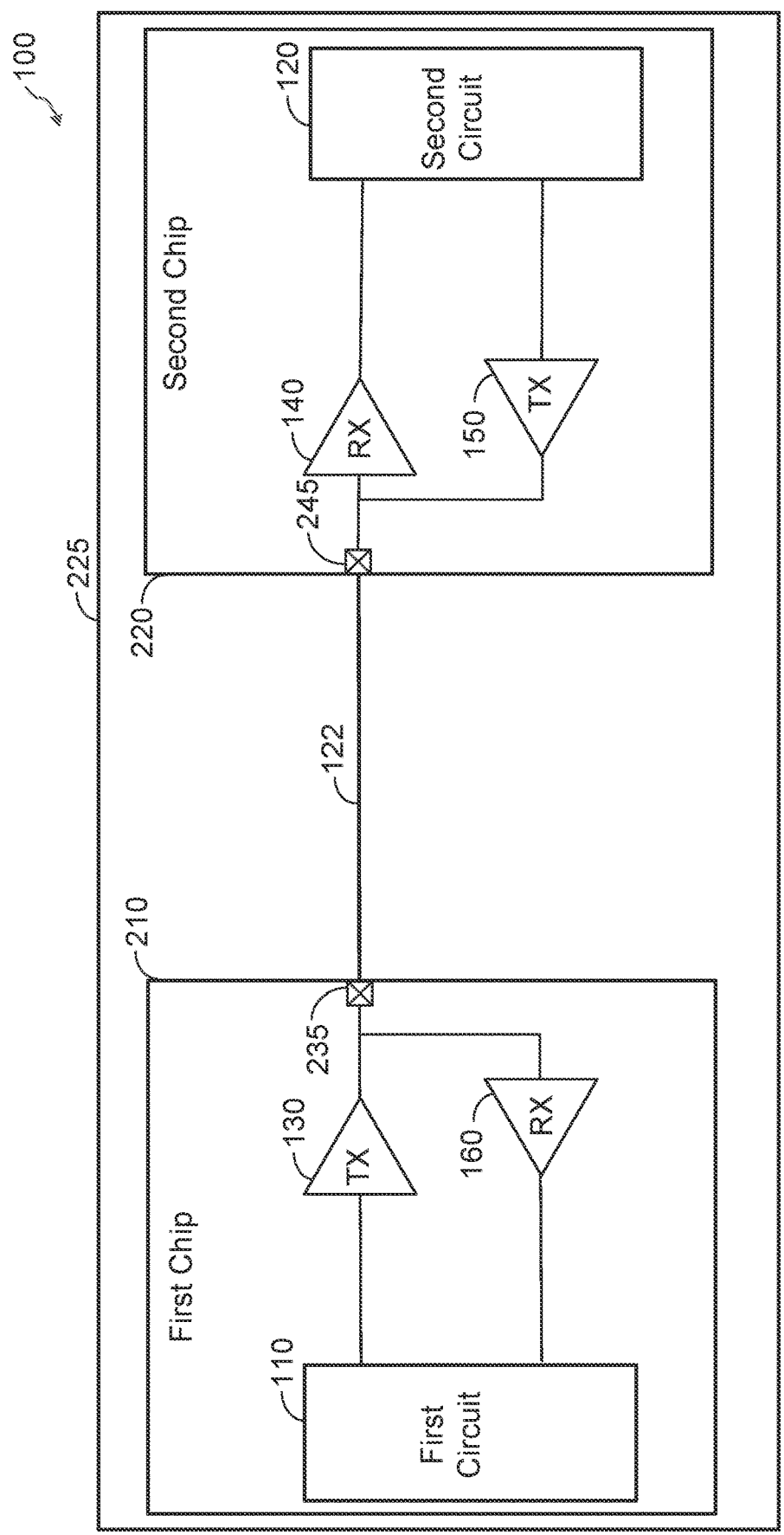
FIG. 2B shows an example in which the transmitters and the receivers of FIG. 2A share a link according to certain aspects of the present disclosure.

FIG. 2B shows an example in which the second transmitter 150 and the second receiver 160 share the first link 122 with the first transmitter 130 and the first receiver 140. In this example, the input of the second receiver 160 is coupled to the first pad 235 of the first chip 210, and the output of the second transmitter 150 is coupled to the first pad 245 of the second chip 220.

Figure 2C:
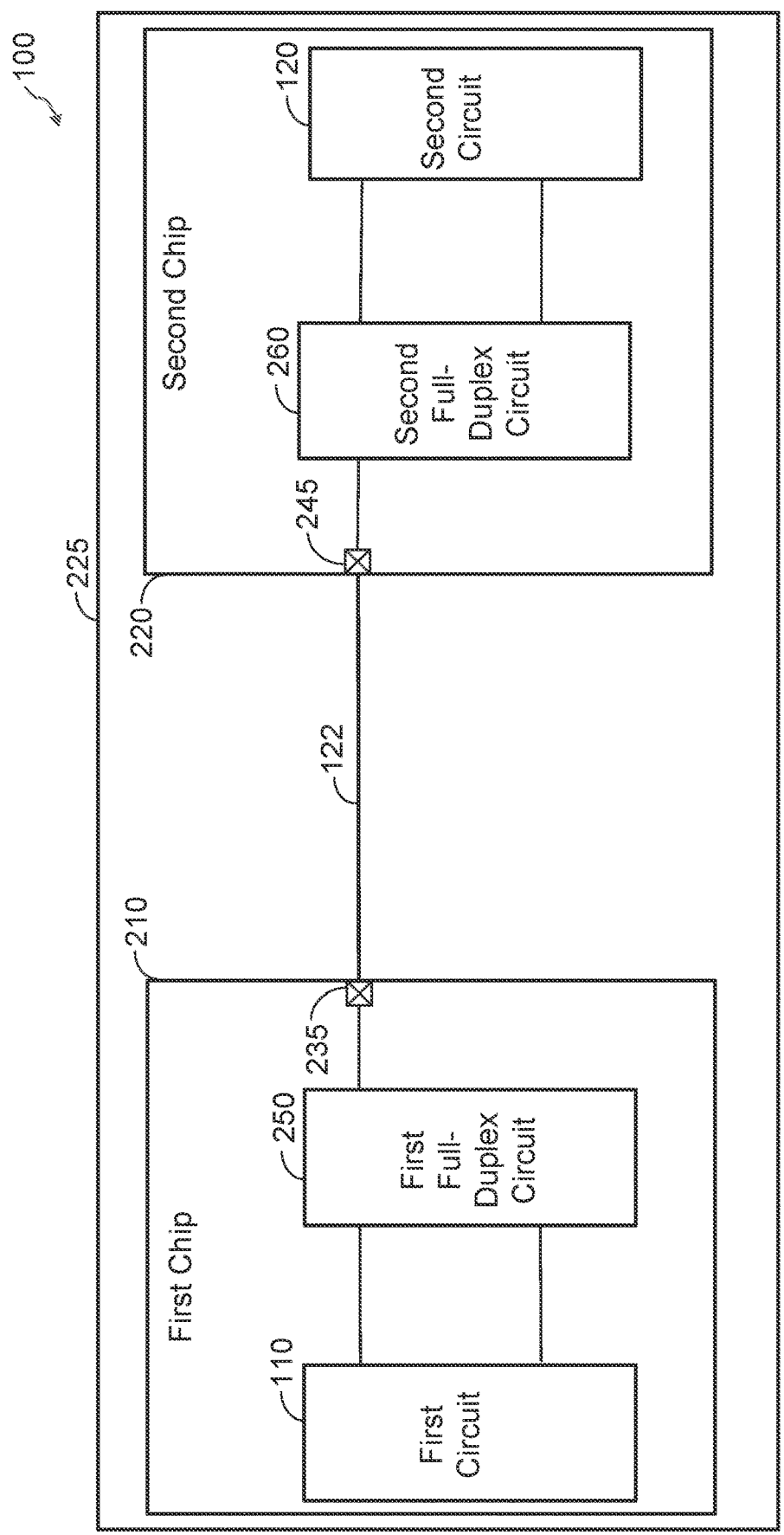
FIG. 2C shows an example of full-duplex circuits facilitating bi-directional communication via a link according to certain aspects of the present disclosure.

FIG. 2C shows an example in which the first chip 210 includes a first full-duplex circuit 250 and the second chip 220 include a second full-duplex circuit 260 to facilitate bi-directional communication between the first chip 210 and the second chip 220 via the link 122. In this example, the first full-duplex circuit 250 is coupled to the first pad 235 of the first chip 210 and the first circuit 110 (e.g., processor). The first full-duplex circuit 250 is configured to transmit an incoming signal from the first circuit 110 to the second chip 220 via the link 122, and receive a signal from the second chip 220 via the link 122. The first full-duplex circuit 250 may include echo cancellation of the local transmit signal to receive the incoming signal from the second chip 220. The second full-duplex circuit 260 is coupled to the first pad 245 of the second chip 220 and the second circuit 120 (e.g., processor). The second full-duplex circuit 260 is configured to transmit an incoming signal from the second circuit 120 to the first chip 210 via the link 122, and receive a signal from the first chip 210 via the link 122. The second full-duplex circuit 260 may include echo cancellation of the local transmit signal to receive the incoming signal from the first chip 210.

Figure 3:
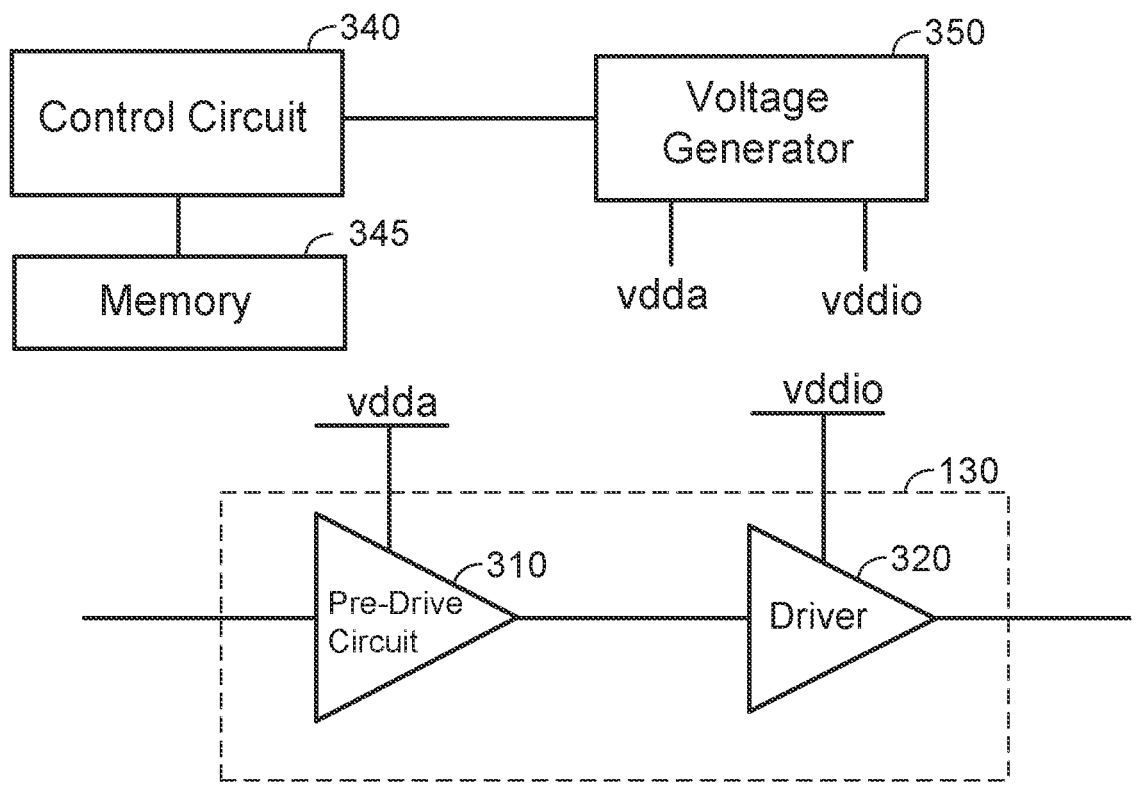
FIG. 3 shows an example of a transmitter including a driver and a pre-drive circuit according to certain aspects of the present disclosure.

FIG. 3 shows an exemplary implementation of the first transmitter 130 according to certain aspects. In this example, the first transmitter 130 includes a pre-drive circuit 310 (also referred to as a pre-driver) and a driver 320. The input of the pre-drive circuit 310 may be coupled to the first circuit 110 (shown in FIGS. 1A, 1B, 2A, and 2B) to receive an input signal from the first circuit 110. The output of the pre-drive circuit 310 is coupled to the input of the driver 320, and the output of the driver 320 is coupled to the first link 122 (shown in FIGS. 1A, 1B, 2A, and 2B).

In the example shown in FIG. 3, the pre-drive circuit 310 is powered with a first supply voltage vdda and the driver 320 is powered with a second supply voltage vddio, which may be different from the first supply voltage vdda. The first circuit 110 may also be powered with the first supply voltage vdda or another supply voltage. As discussed further below, the second supply voltage vddio and the first supply voltage vdda may be dynamically scaled (e.g., based on the frequency of the input signal).

In operation, the pre-drive circuit 310 is configured to receive the input signal (e.g., from the first circuit 110) and drive the input of the driver 320 with a pre-drive signal based on the input signal. For example, the input signal may include bits (e.g., sequential bits) to be transmitted across the first link 122 (e.g., serial link). The pre-drive signal may have a voltage swing of approximately vdda. The driver 320 is configured to receive the pre-drive signal, and drive the first link 122 with an output signal based on the pre-drive signal. For example, the output signal may have a voltage swing of approximately vddio, and may include the bits (e.g., sequential bits) in the input signal.

As discussed above, the second supply voltage vddio and the first supply voltage vdda may be dynamically scaled. In this regard, FIG. 3 shows an example of a voltage generator 350 configured to generate the second supply voltage vddio and the first supply voltage vdda. The voltage generator 350 may be implemented with a power management integrated circuit (PMIC), one or more low dropout (LDO) regulators, one or more switching regulators, one or more DC/DC converters, or any combination thereof.

FIG. 3 also shows an example of a control circuit 340 configured to control the voltage levels of the second supply voltage vddio and the first supply voltage vdda generated by the voltage generator 350. The control circuit 340 may also be referred to as the dynamic voltage controller or another term. In certain aspects, the control circuit 340 may dynamically adjust the second supply voltage vddio and the first supply voltage vdda based on frequency (e.g., frequency of the input signal from the first circuit 110). For example, the control circuit 340 may decrease the second supply voltage vddio and/or decrease the first supply voltage vdda for a lower frequency to conserve power, and increase the second supply voltage vddio and/or increase the first supply voltage vdda for a higher frequency.

In certain aspects, the control circuit 340 may be coupled to a memory 345 storing a voltage-frequency table (e.g., lookup table). The voltage-frequency table indicates a voltage level for the second supply voltage vddio and a voltage level for the first supply voltage vdda for each one of multiple frequencies supported by the system 100. In this example, when the first circuit 110 changes to a new frequency, the control circuit 340 may look up the voltage level of the second supply voltage vddio and the voltage level of first supply voltage vdda in the voltage-frequency table corresponding to the new frequency, and set the second supply voltage vddio and the first supply voltage vdda to the voltage levels indicated in the voltage-frequency table for the new frequency.

Figure 4:
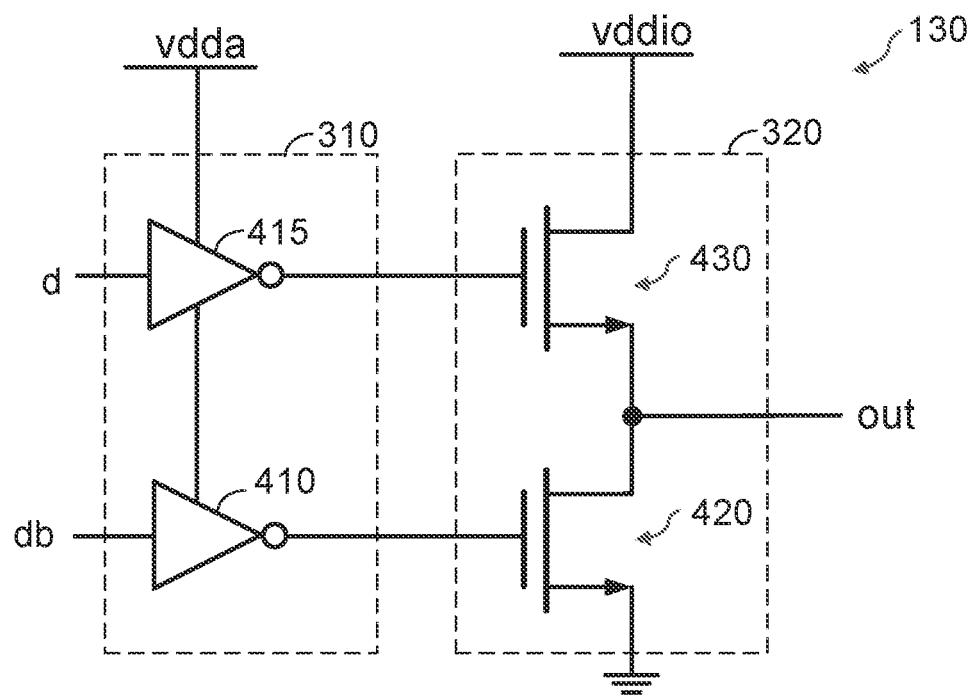
FIG. 4 shows an example of a driver including a pull-up n-type field effect transistor (NFET) according to certain aspects of the present disclosure.

FIG. 4 shows an exemplary implementation of the driver 320 in which the driver 320 includes a pull-down n-type field effect transistor (NFET) 420 and a pull-up NFET 430 (also referred to as N-over-N). In this example, the pre-drive circuit 310 receives complementary input signals d and db (e.g., from the first circuit 110) and drives the gates of the pull-down NFET 420 and the pull-up NFET 430 based on the complementary input signals d and db.

In the example in FIG. 4, the pre-drive circuit 310 includes an inverter 410 configured to drive the gate of the pull-down NFET 420 based on the input signal db, and an inverter 415 configured to drive the gate of the pull-up NFET 430 based on the input signal d. When the input signals d and db are high and low, respectively, the pre-drive circuit 310 turns on the pull-down NFET 420 and turns off the pull-up NFET 430. As a result, the driver 320 pulls the output low (e.g., to ground potential). When the input signals d and db are low and high, respectively, the pre-drive circuit 310 turn off the pull-down NFET 420 and turns on the pull-up NFET 430. As a result, the driver 320 pulls the output high (e.g., to the second supply voltage vddio). As used herein, an "inverter" is a circuit configured to invert a logic state (i.e., logic level or logic value) at an input of the inverter and output the inverted logic state at an output of the inverter. For example, a logic state of one may correspond to a voltage approximately equal to a supply voltage of the inverter, and a logic state of zero may correspond to a ground potential or some reference potential.

The N-over-N implementation allows the driver 320 to achieve low output voltage swing for low power by making the second supply voltage vddio low. However, the N-over-N implementation may limit the upper output voltage swing that can be achieved by the driver 320, and therefore may not be suitable for use cases requiring a high output voltage swing. This is because the first supply voltage vdda needs to be greater than the second supply voltage vddio by at least the threshold voltage of the pull-up NFET 430 in order for the pre-drive circuit 310 to fully turn on the pull-up NFET 430 to pull up the output of the driver 320 to the second supply voltage vddio. As a result, when vdda-vddio is less than the threshold voltage, the output voltage swing of the driver 320 may be below vddio. As used herein, an NFET is fully turned on when the gate-to-source voltage is at or above the threshold voltage of the NFET.

Figure 5:
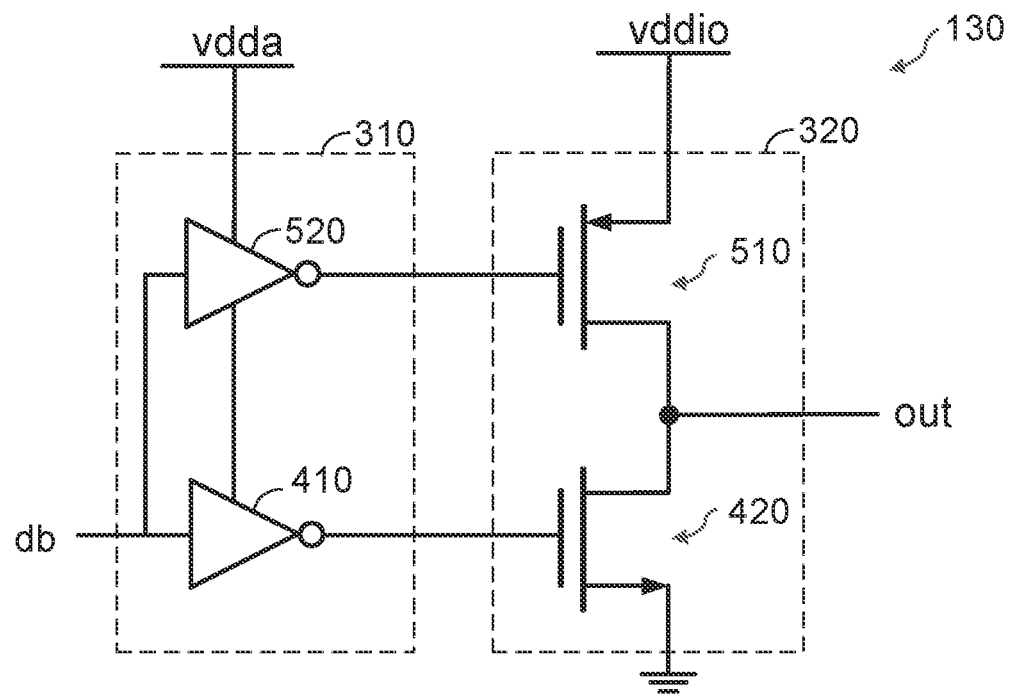
FIG. 5 shows an example of a driver including a pull-up p-type field effect transistor (PFET) according to certain aspects of the present disclosure.

FIG. 5 shows another exemplary implementation of the driver 320 in which the driver 320 includes the pull-down NFET 420 and a pull-up p-type field effect transistor (PFET) 510 (also referred to as P-over-N or complementary driver). In this example, the pre-drive circuit 310 receives complementary input signal db (e.g., from the first circuit 110) and drives the gates of the pull-down NFET 420 and the pull-up PFET 510 based on the input signal db.

In the example in FIG. 5, the pre-drive circuit 310 includes the inverter 410 to drive the gate of the pull-down NFET 420 based on the input signal db. The pre-drive circuit 310 also includes an inverter 520 configured to drive the gate of the pull-up PFET 510 based on the input signal db. When the input signal db is low, the pre-drive circuit 310 turns on the pull-down NFET 420 and turns off the pull-up PFET 510. As a result, the driver 320 pulls the output low (e.g., to ground potential). When the input signal db is high, the pre-drive circuit 310 turn off the pull-down NFET 420 and turns on the pull-up PFET 510. As a result, the driver 320 pulls the output high (e.g., to the second supply voltage vddio).

The P-over-N implementation allows the driver 320 to achieve a high output voltage swing by making the second supply voltage vddio high. However, the P-over-N implementation may limit the lower output voltage swing that can be achieved by the driver 320, and therefore may not be suitable for use cases requiring a low output voltage swing for low power. This is because the second supply voltage vddio needs to be at or above the threshold voltage of the pull-up PFET 510 in order for the pull-up PFET 510 to fully turn on and pull up the output of the driver 320 to the second supply voltage vddio. As a result, the driver 320 may not be able to achieve an output voltage swing that is below the threshold voltage of the pull-up PFET 510. As used herein, a PFET is fully turned on when the source-to-gate voltage is at or above the threshold voltage of the PFET.

Figure 6:
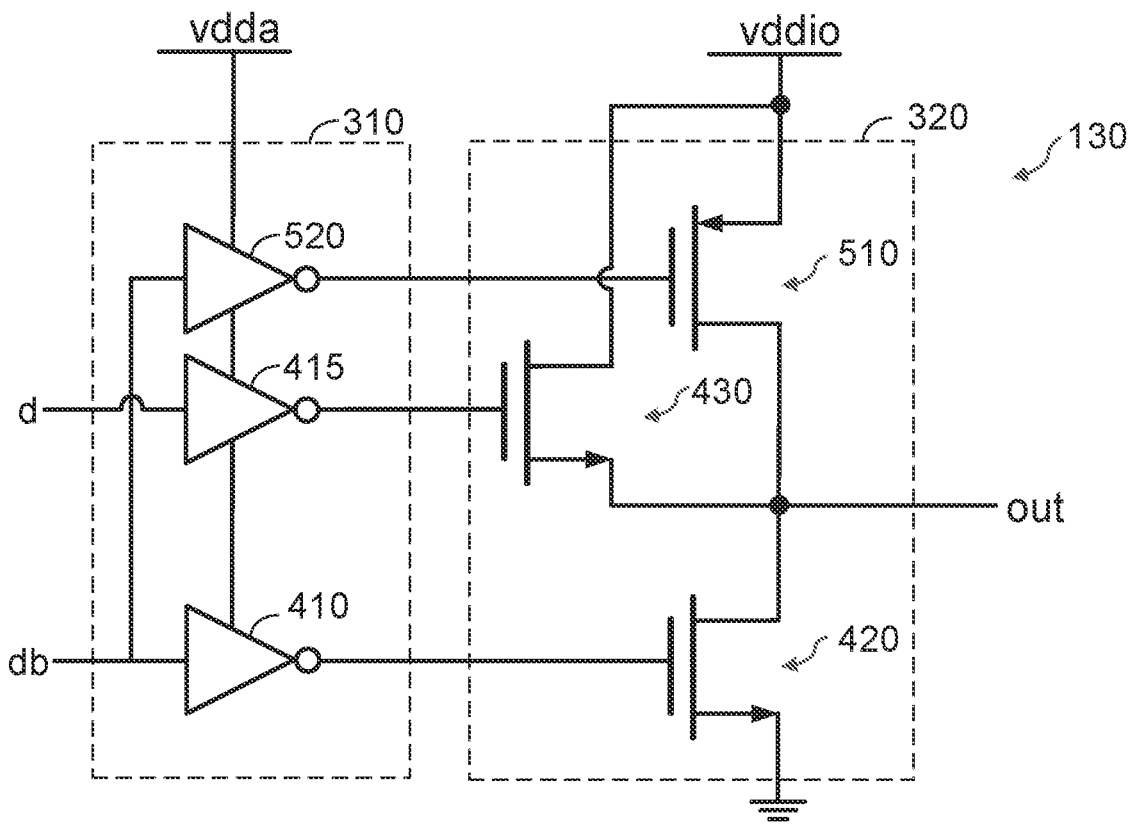
FIG. 6 shows an example of a driver including both a pull-up NFET and a pull-up PFET according to certain aspects of the present disclosure.

FIG. 6 shows an exemplary implementation of the driver 320 that includes both the pull-up NFET 430 and the pull-up PFET 510. In this example, the pre-drive circuit 310 includes the inverter 410 to drive the gate of the pull-down NFET 420, the inverter 415 to drive the gate of the pull-up NFET 430, and the inverter 520 to drive the gate of the pull-up PFET 510.

The combination of the pull-up NFET 430 and the pull-up PFET 510 allows the output voltage swing of the driver 320 to be adjusted (i.e., tuned) over a wider range. This is because the pull-up NFET 430 allows the driver 320 to achieve a low output voltage swing while the pull-up PFET 510 allows the driver 320 to achieve a high output voltage swing. However, including both the pull-up NFET 430 and the pull-up PFET 510 in the driver 320 increases the capacitance at the output of the driver 320, which may reduce the bandwidth of the driver 320 and increase power consumption. In addition, the power of the pre-drive circuit 310 increases since the pre-drive circuit 310 needs to drive two pull-up devices (i.e., the pull-up NFET 430 and the pull-up PFET 510).

To address the above, aspects of the present disclosure provide a negative boost circuit that allows a driver to achieve a lower output voltage swing using a pull-up PFET without the need for a pull-up NFET. The negative boost circuit is configured to generate a negative voltage using a capacitor. The negative voltage is provided to the gate of the pull-up PFET to increase the pull-up strength of the pull-up PFET for a given vddio. The increased pull-strength of the pull-up PFET allows the driver to achieve a lower output voltage swing using the pull-up PFET. Because the driver does not include a pull-up NFET, the driver is able to reduce the power of the pre-drive circuit and reduce the capacitance at the output of the driver compared with a driver that includes both a pull-up PFET and a pull-up NFET. In certain aspects, the negative boost circuit may also include a refresh circuit configured to refresh the charge on the capacitor to maintain a negative boosted voltage on the capacitor. The above features and other features of the present disclosure are discussed further below.

Figure 7A:
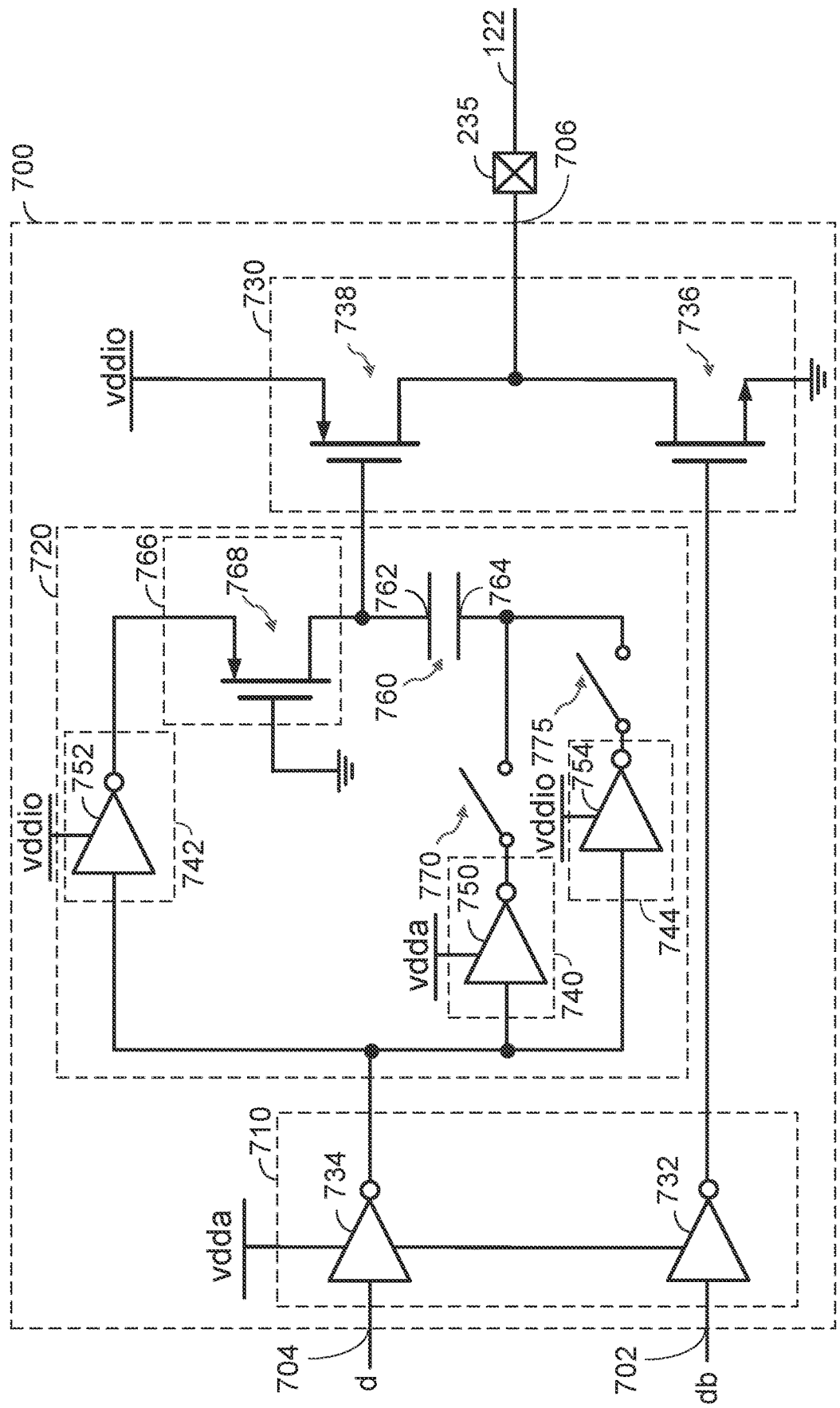
FIG. 7A shows an example of a transmitter including a driver and a negative boost circuit according to certain aspects of the present disclosure.

FIG. 7A shows an example of a transmitter 700 including a pre-drive circuit 710, a negative boost circuit 720, and a driver 730 according to certain aspects. The transmitter 700 may be used to implement the first transmitter 130 and/or the second transmitter 150 discussed above. FIG. 7A shows an example in which the transmitter 700 implements the first transmitter 130 with the output 706 of the transmitter coupled to the first link 122 via the pad 235 to transmit signals over the first link 122. In another example, the transmitter 700 may implemented the transmit portion of the first full-duplex circuit 250. However, it is to be appreciated that the transmitter 700 is not limited to these examples.

The driver 730 includes a pull-down NFET 736 and a pull-up PFET 738. In the example shown in FIG. 7A, the driver 730 does not include a pull-up NFET, which reduces the capacitance at the output 706 of the transmitter 700 compared with a driver that includes both a pull-up NFET and a pull-up PFET. The source of the pull-up PFET 738 is coupled to a supply rail with the second supply voltage vddio, the gate of the pull-up PFET 738 is coupled to the negative boost circuit 720, and the drain of the pull-up PFET 738 is coupled to output 706 of the transmitter 700. The drain of the pull-down NFET 736 is coupled to the output 706 of the transmitter 700, the gate of the pull-down NFET 736 is coupled to the pre-drive circuit 710, and the source of the pull-down NFET 736 is coupled to ground (or some reference potential). It is to be appreciated that the pull-up PFET 738 may be implemented with multiple PFETs arranged in parallel and/or series, and that the pull-down NFET 736 may be implemented with multiple NFETs arranged in parallel and/or series.

The pre-drive circuit 710 is configured to receive complementary input signals d and db (e.g., from the first circuit 110) at inputs 702 and 704, respectively, and drive the pull-down NFET 736 and the negative boost circuit 720 based on the input signals d and db, as discussed further below. In this example, the pre-drive circuit 710 includes a first inverter 732 and a second inverter 734 powered by a supply rail with the first supply voltage vdda. The first inverter 732 is coupled to the gate of the pull-down NFET 736, and the second inverter 734 is coupled to the negative boost circuit 720. The first inverter 732 is configured to receive the input signal db and drive the gate of the pull-down NFET 736 based on the input signal db. The second inverter 734 is configured to receive the input signal d and drive the negative boost circuit 720 based on the input signal d. However, it is to be appreciated that the pre-drive circuit 710 is not limited to this example. The supply rail with the first supply voltage vdda may be referred to as the first supply rail, and the supply rail with the second supply voltage vddio may be referred to as the second supply rail.

The negative boost circuit 720 is coupled between the pre-drive circuit 710 and the gate of the pull-up PFET 738. The negative boost circuit 720 includes a first drive circuit 740, a second drive circuit 742, a third drive circuit 744. Each of the drive circuits 740, 742, and 744 may include one or more inverters. In the example shown in FIG. 7A, the first drive circuit 740 includes a first inverter 750, the second drive circuit 742 includes a second inverter 752, and the third drive circuit 744 includes a third inverter 754. The first drive circuit 740 is configured to receive the first supply voltage vdda to power the first drive circuit 740, the second drive circuit 742 is configured to receive the second supply voltage vddio to power the second drive circuit 742, and the third drive circuit 744 is configured to receive the second supply voltage vddio to power the third drive circuit 744. However, it is to be appreciated that the drive circuits 740, 742, and 744 are not limited to this example. The input of each of the drive circuits 740, 742, and 744 is coupled to the pre-drive circuit 710 (e.g., the output of the second inverter 734 in the pre-drive circuit 710).

The negative boost circuit 720 also includes a capacitor 760 having a first terminal 762 (i.e., first capacitor plate) and a second terminal 764 (i.e., second capacitor plate). The first terminal 762 is coupled to the gate of the pull-up PFET 738. The negative boost circuit 720 also includes a first switch 766 coupled between the output of the second drive circuit 742 (e.g., the second inverter 752) and the gate of the pull-up PFET 738. In the example in FIG. 7A, the first switch 766 includes a PFET 768 with a gate coupled to ground (or some reference potential). As discussed further below, the first switch 766 is configured to turn on when the output of the second drive circuit 742 is driven high (e.g., vddio) and turn off when the output of the second drive circuit 742 is driven low (e.g., ground potential).

The negative boost circuit 720 also includes a second switch 770 between the output of the first drive circuit 740 (e.g., the first inverter 750) and the second terminal 764 of the capacitor 760, and a third switch 775 between the output of the third drive circuit 744 (e.g., the third inverter 754) and the second terminal 764 of the capacitor 760. In this example, the second switch 770 and the third switch 775 control whether the negative boost circuit 720 operates in a boost mode or a non-boost mode. More particularly, the negative boost circuit 720 operates in the boost mode when the second switch 770 is turned on (i.e., closed) and the third switch 775 is turned off (i.e., open), and the negative boost circuit 720 operates in the non-boost mode when the second switch 770 is turned off (i.e., open) and the third switch 775 is turned on (i.e., closed). Each of the switches 770 and 775 may be implemented with a one or more transistors, a transmission gate, or another type of switch. The boost mode and the non-boost mode are discussed further below.

Figure 7B:
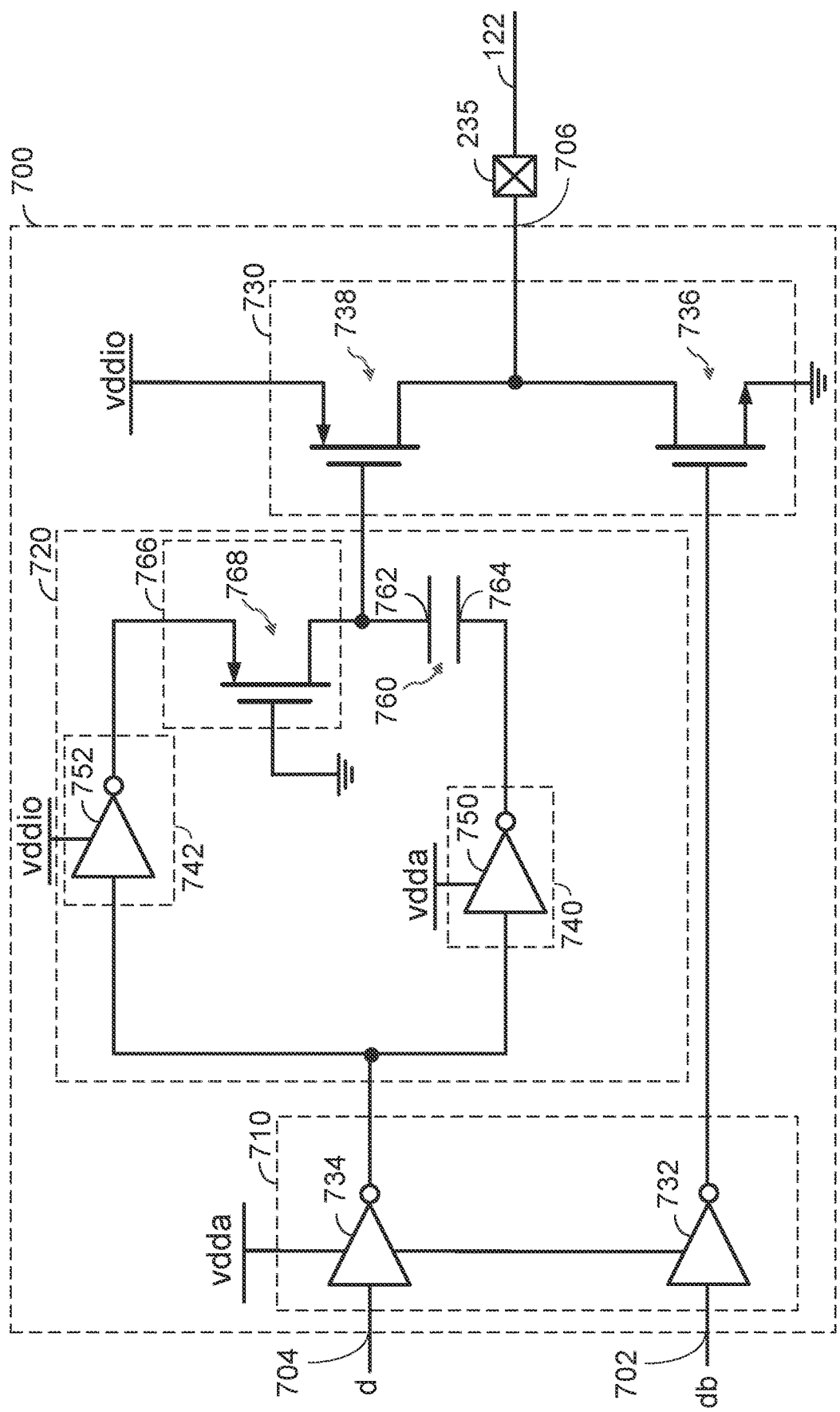
FIG. 7B shows an example of an equivalent circuit of the transmitter of FIG. 7A in a boost mode according to certain aspects of the present disclosure.

In certain aspects, the control circuit 340 (shown in FIG. 3) controls whether the negative boost circuit 720 operates in the boost mode or the non-boost mode based on the voltage-frequency table discussed above. For example, the control circuit 340 may operate the negative boost circuit 720 in the boost mode when the voltage-frequency table indicates that the first supply voltage vdda is greater (i.e., higher) than the second supply voltage vddio for the current frequency (i.e., vdda>vddio). To operate the negative boost circuit 720 in the boost mode, the control circuit 340 turns on the second switch 770 and turns off the third switch 775. This couples the output of the first drive circuit 740 (e.g., first inverter 750) to the second terminal 764 of the capacitor 760. FIG. 7B shows an example of an equivalent circuit diagram of the negative boost circuit 720 in the boost mode. As discussed further below, the negative boost circuit 720 provides a negative boosted voltage approximately equal to vddio-vdda to the gate of the pull-up PFET 738 in the boost mode to increase the pull-up strength of the pull-up PFET 738.

Figure 7C:
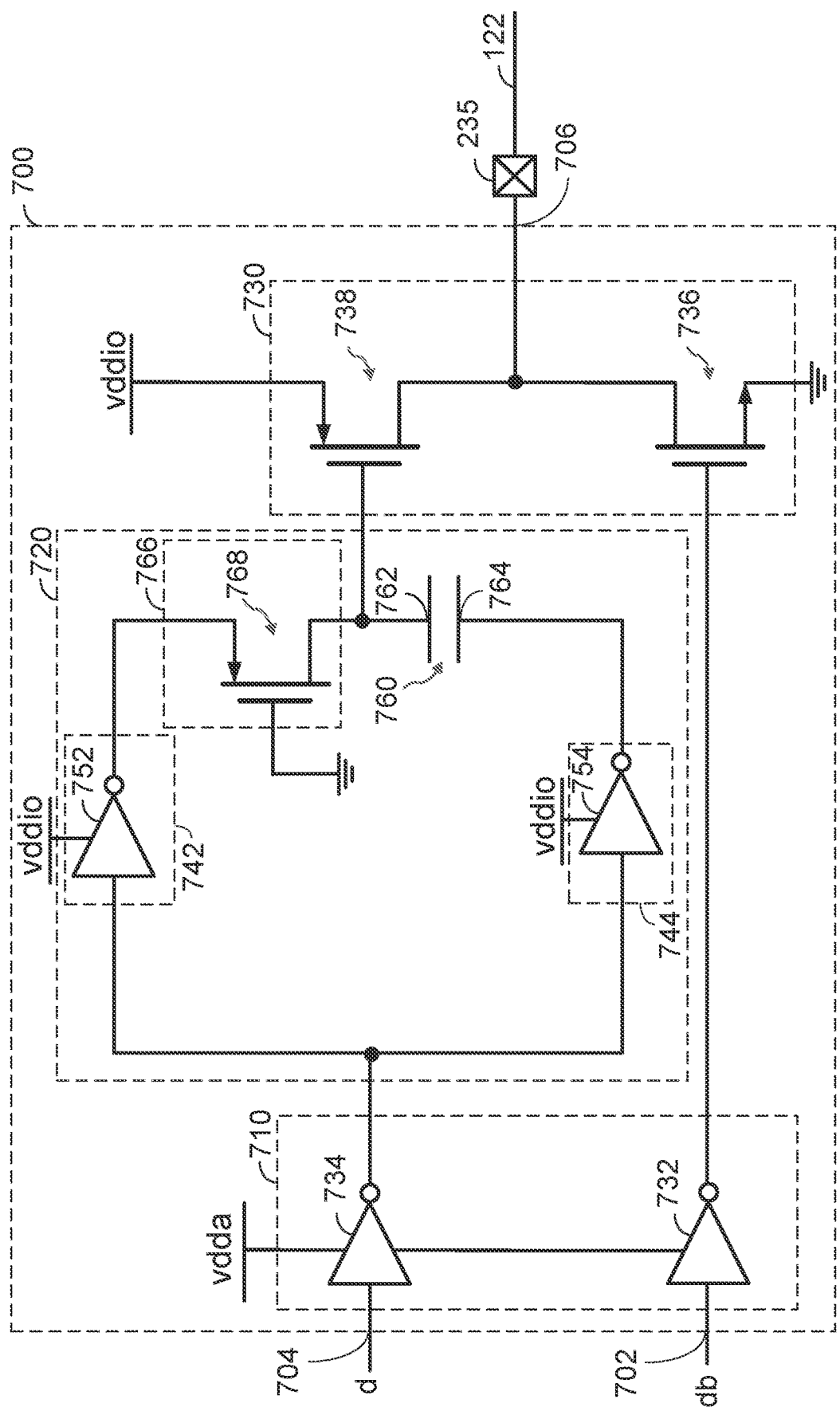
FIG. 7C shows an example of an equivalent circuit of the transmitter of FIG. 7A in a non-boost mode according to certain aspects of the present disclosure.

The control circuit 340 may operate the negative boost circuit 720 in the non-boost mode when the voltage-frequency table indicates that the first supply voltage vdda is less (i.e., lower) than the second supply voltage vddio for the current frequency (i.e., vdda<vddio). To operate the negative boost circuit 720 in the non-boost mode, the control circuit 340 turns off the second switch 770 and turns on the third switch 775. This couples the output of the third drive circuit 744 (e.g., third inverter 754) to the second terminal 764 of the capacitor 760. FIG. 7C shows an example of an equivalent circuit diagram of the negative boost circuit 720 in the non-boost mode.

Example operations of the negative boost circuit 720 in the boost mode will now be discussed according to certain aspects.

When the input signals d and db are high and low, respectively, the output of the first inverter 732 in the pre-drive circuit 710 is high (e.g., vdda) and the output of the second inverter 734 in the pre-drive circuit 710 is low (e.g., ground potential). Because the output of the first inverter 732 is high, the first inverter 732 turns on the pull-down NFET 736.

In this example, the low output of the second inverter 734 is input to the first drive circuit 740 and the second drive circuit 742. This causes the output of the first drive circuit 740 to pull up to the first supply voltage vdda and the output of the second drive circuit 742 to pull up to the second supply voltage vddio. Note that the first drive circuit 740 is powered by vdda and the second drive circuit 742 is powered by vddio in this example.

The high output (e.g., vddio) of the second drive circuit 742 causes the first switch 766 to turn on. For the example where the first switch 766 is implemented with the PFET 768, the high output of the second drive circuit 742 causes the source-to-gate voltage of the PFET 768 to be approximately equal to vddio, which turns on the PFET 768 (assuming that vddio is greater than the threshold voltage of the PFET 768).

Since the first switch 766 is turned on, the second drive circuit 742 pulls the gate of the pull-up PFET 738 to the second supply voltage vddio through the first switch 766, which turns off the pull-up PFET 738. The second drive circuit 742 also pulls up the first terminal 762 of the capacitor 760 to the second supply voltage vddio.

The first drive circuit 740 pulls up the second terminal 764 of the capacitor 760 to the first supply voltage vdda. Thus, a voltage of vddio is applied to the first terminal 762 of the capacitor 760 by the second drive circuit 742, and a voltage of vdda is applied to the second terminal 764 of the capacitor 760 by the first drive circuit 740. As a result, a voltage of vddio—vdda appears across the capacitor 760, which is a negative voltage since vdda is greater than vddio in the boost mode.

Thus, in this example, when the input signals d and db are high and low, respectively, the pull-down NFET 736 is turned on and the pull-up PFET 738 is turned off. As a result, the driver 730 pulls the output 706 of the transmitter 700 low (e.g., ground potential).

When the input signals d and db are low and high, respectively, the output of the first inverter 732 in the pre-drive circuit 710 is low (e.g., ground potential) and the output of the second inverter 734 in the pre-drive circuit 710 is high (e.g., vdda). Because the output of the first inverter 732 is low, the first inverter 732 turns off the pull-down NFET 736.

In this example, the high output of the second inverter 734 is input to the first drive circuit 740 and the second drive circuit 742. This causes the output of the first drive circuit 740 and the output of the second drive circuit 742 to both pull down to ground potential.

The low output of the second drive circuit 742 causes the first switch 766 to turn off. For the example where the first switch 766 is implemented with the PFET 768, the low output of the second drive circuit 742 causes the source-to-gate voltage of the PFET 768 to be approximately equal to zero volts, which turns off the PFET 768. Because the first switch 766 is turned off, the first switch 766 decouples (i.e., isolates) the output of the second drive circuit 742 from the gate of the pull-up PFET 738 and the first terminal 762 of the capacitor.

The first drive circuit 740 pulls the second terminal 764 of the capacitor 760 to ground potential. Since the first terminal 762 of the capacitor 760 is isolated from the output of the second drive circuit 742 by the first switch 766, the ground potential at the second terminal 764 of the capacitor 760 causes the voltage of vddio-vdda to appear at the first terminal 762 of the capacitor 760 due to charge conservation. The voltage of vddio-vdda is negative since vdda is greater than vddio in the boost mode, and thereof provides a negative boosted voltage. The negative boosted voltage (i.e., vddio-vdda) is provided to the gate of the pull-up PFET 738 since the first terminal 762 of the capacitor 760 is coupled to the gate of the pull-up PFET 738. The negative boosted voltage increases the drive strength of the pull-up PFET 738 compared with the case where the gate of the pull-up PFET 738 is pulled to ground potential. The increased drive strength allows the pull-up PFET 738 to pull up the output 706 of the transmitter 700 at lower voltage levels for the second supply voltage vddio, and therefore allows the driver 730 to achieve lower output voltage swings.

Because the first switch 766 is turned off, the first switch 766 isolates the output of the second drive circuit 742 from the negative boosted voltage (i.e., vddio-vdda) at the gate of the pull-up PFET 738. This prevents the output of the second drive circuit 742 from going below zero volts, which helps avoid a voltage overstress condition in the second drive circuit 742. The isolation also prevents the output of the second drive circuit 742 from altering the negative voltage boosting at the gate of the pull-up PFET 738.

Example operations of the negative boost circuit 720 in the non-boost mode will now be discussed according to certain aspects. As discussed above, in the non-boost mode, the third drive circuit 744 drives the second terminal 764 of the capacitor 760, and the second supply voltage vddio is higher than the first supply voltage vdda.

When the input signals d and db are high and low, respectively, the output of the first inverter 732 in the pre-drive circuit 710 is high (e.g., vdda) and the output of the second inverter 734 in the pre-drive circuit 710 is low (e.g., ground potential). Because the output of the first inverter 732 is high, the first inverter 732 turns on the pull-down NFET 736.

In this example, the low output of the second inverter 734 is input to the second drive circuit 742 and the third drive circuit 744. This causes the output of the second drive circuit 742 and the output of the third drive circuit 744 to pull up to vddio. Note that the second drive circuit 742 and the third drive circuit 744 are both powered by the second supply voltage vddio in this example.

The high output (e.g., vddio) of the second drive circuit 742 causes the first switch 766 to turn on. This allows the second drive circuit 742 to pull the gate of the pull-up PFET 738 to the second supply voltage vddio through the first switch 766, which turns off the pull-up PFET 738. The second drive circuit 742 also pulls up the first terminal 762 of the capacitor 760 to the second supply voltage vddio.

The third drive circuit 744 pulls up the second terminal 764 of the capacitor to the second supply voltage vddio. Thus, the voltage at the first terminal 762 of the capacitor 760 and the voltage at the second terminal 764 of the capacitor 760 are both approximately equal to vddio, and the voltage difference across the capacitor 760 is approximately zero volts. As a result, negative voltage boosting is not enabled in the non-boost mode.

When the input signals d and db are low and high, respectively, the output of the first inverter 732 in the pre-drive circuit 710 is low (e.g., ground potential) and the output of the second inverter 734 in the pre-drive circuit 710 is high (e.g., vdda). Because the output of the first inverter 732 is low, the first inverter 732 turns off the pull-down NFET 736.

In this example, the high output of the second inverter 734 is input to the second drive circuit 742 and the third drive circuit 744. This causes the output of the second drive circuit 742 and the output of the third drive circuit 744 to both pull down to ground potential.

The low output of the second drive circuit 742 causes the first switch 766 to turn off, and decouple (i.e., isolate) the output of the second drive circuit 742 from the gate of the pull-up PFET 738 and the first terminal 762 of the capacitor 760. The third drive circuit 744 pulls the second terminal 764 of the capacitor 760 to ground potential. Since the voltage difference across the capacitor 760 is approximately zero volts, this causes the voltage at the first terminal 762 of the capacitor 760 to be approximately equal to zero volts. The zero volts at the first terminal 762 of the capacitor 760 causes the pull-up PFET 738 to turn on and pull up the output 706 of the transmitter 700 (assuming that the second supply voltage vddio in the non-boost mode is equal to or greater than the threshold voltage of the pull-up PFET 738).

Ideally, the voltage at the gate of the pull-up PFET 738 is at zero volts when the pull-up PFET 738 is turned on in the non-boost mode. However, when vddio>vdda, the gate of the pull-up PFET 738 may have a small positive voltage (e.g., 20 to 40 mV) due to parasitic capacitors. The parasitic capacitors may be due to the gate-to-drain capacitance and the gate-to-source capacitance of the pull-up PFET 738, and the capacitance of the routing between the gate of the pull-up PFET 738 and the first terminal 762 of the capacitor 760. In this example, when the pull-up PFET 738 is turned on, the charge stored in the parasitic capacitors are distributed between the parasitic capacitors and the capacitor 760, resulting in a small positive voltage at the first terminal 762 of the capacitor 760.

The small positive voltage at the first terminal 762 of the capacitor 760 appears between the drain and the gate of the PFET 768 in the first switch 766, which may cause the PFET 768 to operate in the subthreshold region and leak subthreshold current from the first terminal 762 of the capacitor 760 to the second drive circuit 742. Thus, the small positive voltage can cause leakage current to flow from the first terminal 762 of the capacitor 760 to the second drive circuit 742.

Figure 8:
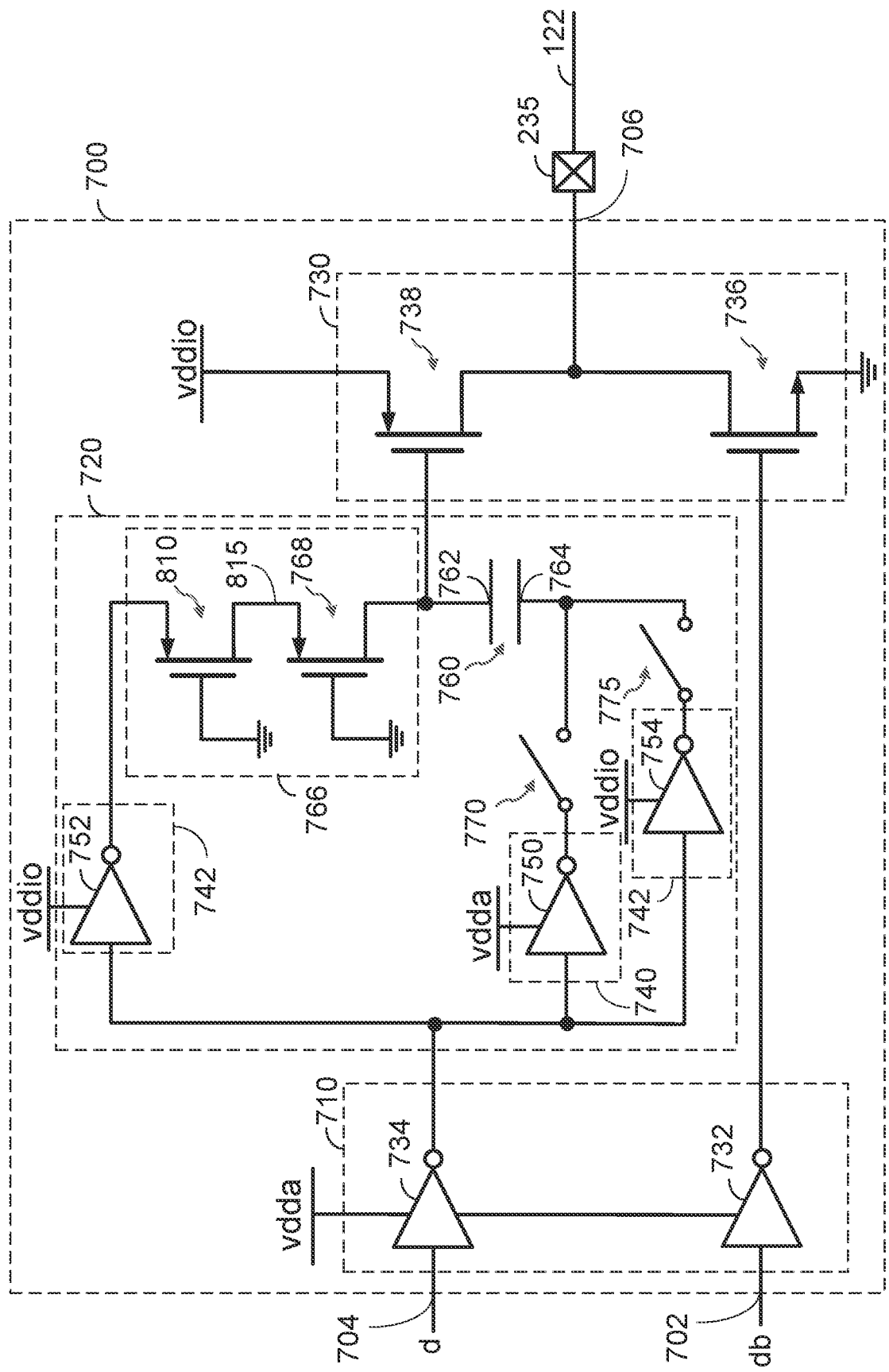
FIG. 8 shows an example in which the negative boost circuit includes a switch with stacked transistors according to certain aspects of the present disclosure.

FIG. 8 shows an example in which the first switch 766 includes stacked transistors to reduce the leakage current in certain aspects. In this example, the first switch 766 includes the PFET 768 discussed above and another PFET 810 stacked with the PFET 768 to reduce leakage current. The PFETs 768 and 810 are coupled in series between the output of the second drive circuit 742 and the first terminal 762 of the capacitor 760, and the gates of the PFETs 768 and 810 are coupled to ground.

In this example, the positive voltage at the first terminal 762 of the capacitor 760 is divided between the PFETs 768 and 810, in which voltage at the net 815 between the PFETs 768 and 810 is between the positive voltage at the first terminal 762 of the capacitor 760 and zero volts (i.e., lower than the positive voltage). As a result, the drain-to-gate voltage of the PFET 810 is lower than the positive voltage at the first terminal 762 of the capacitor 760, which reduces the subthreshold current of the PFET 810. This reduces the current leakage flow through the first switch 766 since the PFET 810 is coupled in series with the PFET 768.

As discussed above, in the boost mode, the negative boost circuit 720 provides the gate of the pull-up PFET 738 with a negative boosted voltage to increase the pull-up strength of the pull-up PFET. The negative boosted voltage is provided by the capacitor 760, which provides a negative boosted voltage of vddio-vdda due to charge conservation. In this example, the negative boost circuit 720 may need to maintain the negative boosted voltage over multiple bit periods in some cases. For example, in some cases, the input data signal d may include multiple consecutive bits with the same bit value that cause the negative boost circuit 720 to stay in the negative boost condition over the consecutive bits.

During this time, the charge on the capacitor 760 may leak, causing the negative boosted voltage to drift over time.

To address leakage of the capacitor 760, aspects of the present disclosure refresh the charge on the capacitor 760 using a control signal (e.g., control bits), as discussed further below.

Figure 9:
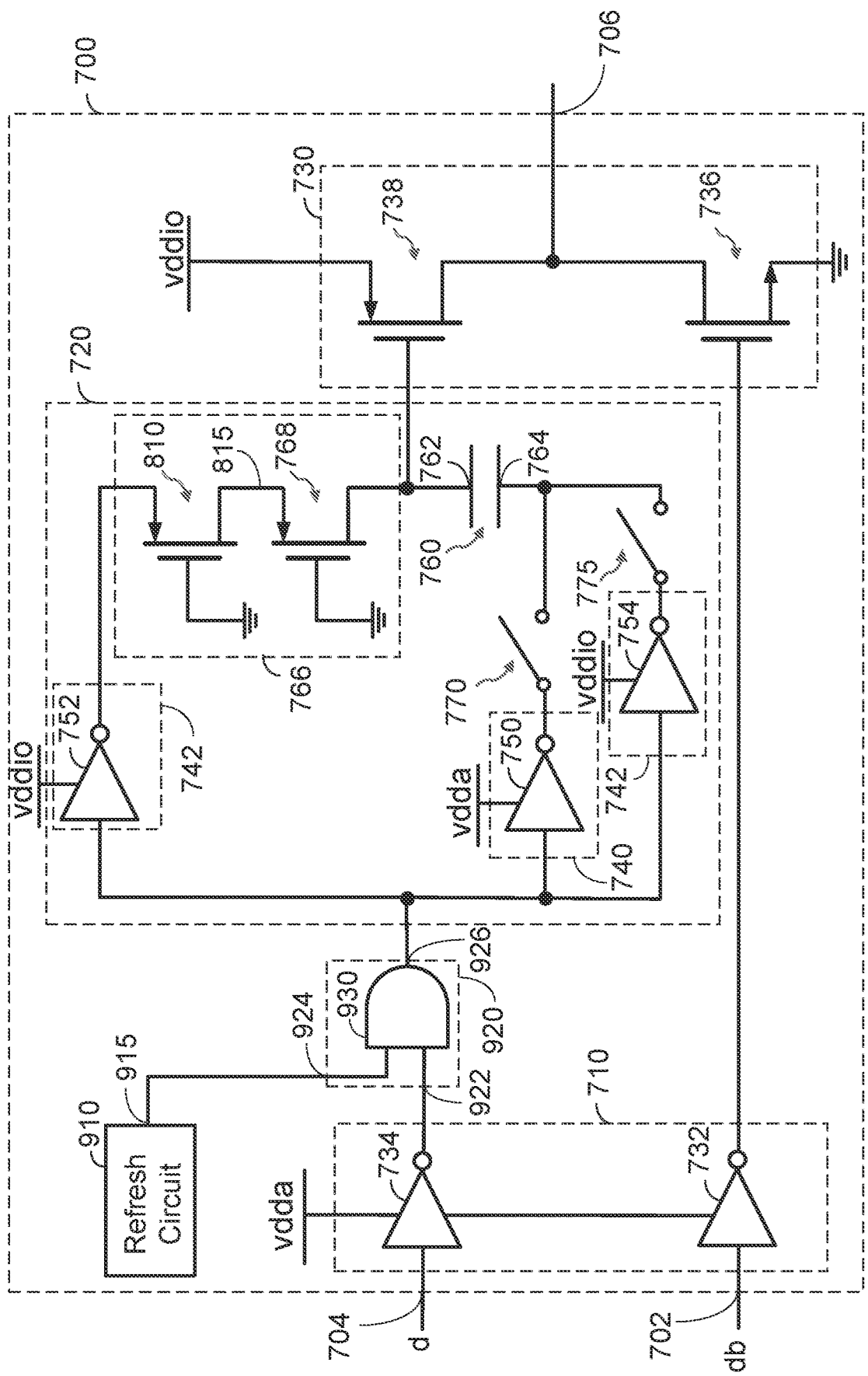
FIG. 9 shows an example of a refresh circuit for refreshing the charge of a capacitor in the negative boost circuit according to certain aspects of the present disclosure.

FIG. 9 shows an example in which the negative boost circuit 720 includes a logic gate 920 and a refresh circuit 910. In this example, the logic gate 920 has a first input 922, a second input 924, and an output 926. The first input 922 is coupled to the pre-drive circuit 710 (e.g., the output of the inverter 734 in the pre-drive circuit 710), the second input 924 is coupled to an output 915 of the refresh circuit 910, and the output 926 is coupled to the inputs of the drive circuits 740, 742, and 744. The refresh circuit 910 is configured to output a control signal (e.g., control bits) to the second input 924 of the logic gate 920, in which the control signal controls whether the logic gate 920 passes the pre-drive signal from the pre-drive circuit 710 to the inputs of the drive circuits 740 and 742 or the logic gate 920 initiates a refresh operation, as discussed further below.

In the example shown in FIG. 9, the logic gate 920 is implemented with an AND gate 930. It is to be appreciated that the AND gate 930 may be implemented with a combination of logic gates (e.g., a NAND gate and an inverter). It is also to be appreciated that the logic gate 920 is not limited to the AND gate 930, and that the logic gate 920 may be implemented with other types of logic gates or combinations of logic gates. Exemplary operations of the logic gate 920 and the refresh circuit 910 are discussed below using the example in which the logic gate 920 is implemented with the AND gate 930. However, it is to be appreciated that the present disclosure is not limited to this example.

In the example shown in FIG. 9, the logic gate 920 passes the pre-drive signal from the pre-drive circuit 710 to the inputs of the drive circuits 740 and 742 when the refresh circuit 910 outputs a logic one (e.g., a control bit of one) to the second input 924 of the logic gate 920. This is because the output 926 of the logic gate 920 tracks the logic value of the pre-drive signal at the first input 922 when the second input 924 is at logic one. Thus, in this example, the refresh circuit 910 outputs a logic one to the second input 924 of the logic gate 920 to cause the logic gate 920 to pass the pre-drive signal.

To initiate a refresh operation, the refresh circuit 910 outputs a logic zero to the second input of the logic gate 920. This causes the output 926 of the logic gate 920 to output a logic zero at the output 926 of the logic gate 920. The logic zero is input to the inputs of the drive circuits 740 and 742, which causes the first drive circuit 740 to pull the second terminal 764 of the capacitor 760 to vdda and the second drive circuit 742 to pull the first terminal 762 of the capacitor 760 to vddio. This refreshes the charge on the capacitor 760 by restoring the voltage of vddio-vdda across the capacitor 760.

The refresh circuit 910 controls the duration of a refresh operation by controlling the duration that the refresh circuit 910 outputs the logic zero to the second input 924 of the logic gate 920. In certain aspects, the refresh circuit 910 may initiate a refresh operation when the negative boost circuit 720 is in the negative boost condition to correct for drift in the negative boosted voltage at the gate of the pull-up PFET 738 due to charge leakage of the capacitor 760. In the negative boost condition, the pull-up PFET 738 is turned on to pull the output 706 of the transmitter 700 to vddio. In this example, the refresh operation temporarily turns off the pull-up PFET 738 to refresh the charge on the capacitor 760.

However, the voltage at the output 706 of the transmitter 700 takes time to drop after the pull-up PFET 738 is turned off. Therefore, the refresh circuit 910 may keep the voltage drop at the output 706 of the transmitter 700 small by making the duration of the refresh operation short. For example, the rate at which the output voltage of the transmitter 700 drops may be a function of a resistor-capacitor (RC) time constant associated with the first link 122. In this example, the refresh circuit 910 may keep the output voltage drop of the transmitter 700 small by making the duration of the refresh operation less than the RC time constant.

The refresh circuit 910 may periodically initiate refresh operations in the negative boost circuit 720 using the control signal to maintain the negative boosted voltage at or close to the negative voltage of vddio-vdda. This avoids the need for a negative voltage rail to provide a steady negative voltage, which may require large devices and switching capacitors driven by a clock signal.

FIG. 10A shows an exemplary implementation of the refresh circuit 910 according to certain aspects. In this example, the refresh circuit 910 includes a first AND gate 1010, a second AND gate 1020, a first inverter 1050, a second inverter 1060, a delay circuit 1040, an OR gate 1030, and a third inverter 1070. Also, in this example, the refresh circuit 910 has an input 1005 configured to receive a refresh timing signal that controls the timing of the refresh operations.

In this example, the first AND gate 1010 has a first input 1012 coupled to the input 1005, a second input 1014, and an output 1016. The second AND gate 1020 has a first input 1022, a second input 1024, and an output 1026. The delay circuit 1040 and the first inverter 1050 are coupled between the input 1005 and the second input 1014 of the first AND gate 1010, the delay circuit 1040 is coupled between the input 1005 and the first input 1022 of the second AND gate 1020, and the second inverter 1060 is coupled between the input 1005 and the second input 1024 of the second AND gate 1020. The OR gate 1030 has a first input 1032 coupled to the output 1016 of the first AND gate 1010, a second input 1034 coupled to the output 1026 of the second AND gate 1020, and an output 1036. The third inverter 1070 is coupled between the output 1036 of the OR gate 1030 and the output 915 of the refresh circuit 910.

FIG. 10B is a timing diagram showing an example of the refresh timing signal 1080, the signal 1086 at the output 1016 of the first AND gate 1010, the signal 1088 at the output 1026 of the second AND gate 1020, the signal 1090 at the output 1036 of the OR gate 1030, and the signal 1092 at the output 915 of the refresh circuit 910 (i.e., the control signal input to the second input 924 of the logic gate 920). In this example, the refresh timing signal 1080 is a substantially periodic signal that alternates between high and low.

As shown in FIG. 10B, the first AND gate 1010 generates a first positive pulse 1087 on the rising edge 1082 of the refresh timing signal 1080. The width of the first positive pulse 1087 is equal to the time delay of the delay circuit 1040. The second AND gate 1020 generates a second positive pulse 1089 on the falling edge 1084 of the refresh timing signal 1080. The width of the second positive pulse 1089 is also equal to the time delay of the delay circuit 1040. The OR gate 1030 passes the first positive pulse 1087 and the second positive pulse 1089. As shown in FIG. 10B, the signal 1090 at the output 1036 of the OR gate 1030 includes the first positive pulse 1087 and the second positive pulse 1089. The third inverter 1070 inverts the first positive pulse 1087 into a first negative pulse 1094, and inverts the second positive pulse 1089 into a second negative pulse 1096.

The first negative pulse 1094 and the second negative pulse 1096 are output to the second input 924 of the logic gate 920 (shown in FIG. 9). The first negative pulse 1094 initiates a first refresh operation in the negative boost circuit 720, and the second negative pulse 1096 initiates a second refresh operation in the negative boost circuit 720. The duration of each refresh operation is equal to the width of the respective negative pulse. Since the width of each of the negative pulses 1094 and 1096 is equal to the delay of the delay circuit 1040, the duration of each refresh operation may be set to a desired duration by setting the delay of the delay circuit 1040 to the desired duration.

In this example, the timing of the negative pulses 1094 and 1096 (and hence the timing of the refresh operations) is controlled by the period of the refresh timing signal 1080. Thus, the periodicity of the refresh operations is controlled by the period of the refresh timing signal 1080. In this example, the refresh timing signal may be generated by a low-frequency clock generator (not shown) or another type of circuit.

In its to be appreciated that the refresh circuit 910 is not limited to the exemplary implementation shown in FIG. 10A, and the refresh circuit 910 may be implemented with other types of pulse generators configured to generate pulses (e.g., the negative pulses 1094 and 1096) to initiate refresh operations.

Figure 11:
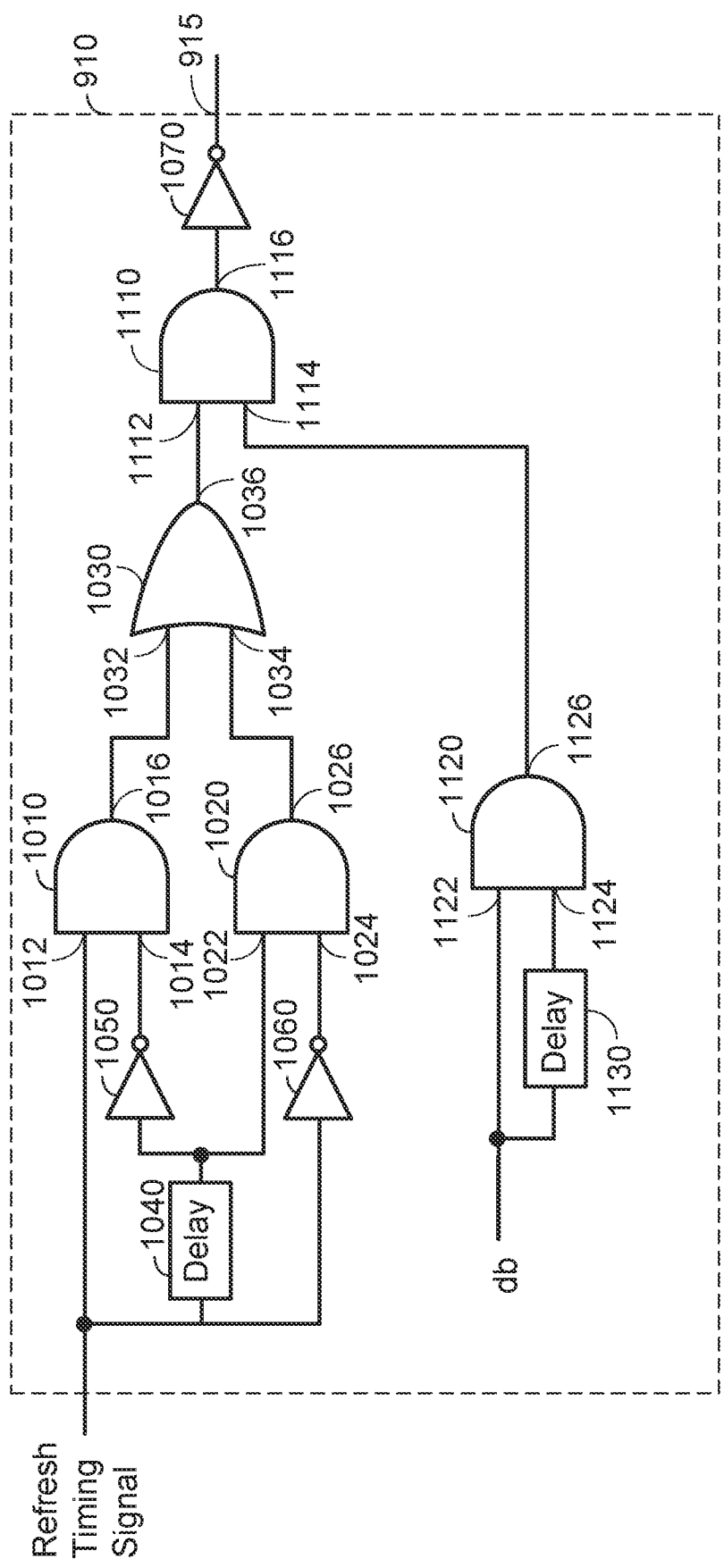
FIG. 11 shows another exemplary implementation of the refresh circuit according to certain aspects of the present disclosure.

FIG. 11 shows an example in which the refresh circuit 910 includes logic for enabling or disabling refresh operations. In this example, the logic includes a third AND gate 1110 between the OR gate 1030 and the third inverter 1070. The third AND gate 1110 has a first input 1112 coupled to the output 1036 of the OR gate 1030, a second input 1114, and an output 1116 coupled to the input of the third inverter 1070. In this example, the third AND gate 1110 enables or disables refresh operations based on the logic value at the second input 1114. More particularly, the third AND gate 1110 enables refresh operations when the logic value at the second input 1114 is one, and disables refresh operations when the logic value at the second input 1114 is zero.

In this example, the refresh circuit 910 also includes a fourth AND gate 1120 and a second delay circuit 1130. The fourth AND gate 1120 has a first input 1122, a second input 1124, and an output 1126. The first input 1122 is configured to receive the input signal db, and the second input 1124 is configured to receive a delayed version of the input signal db delayed by the second delay circuit 1130. The output 1126 is coupled to the second input 1114 of the third AND gate 1110.

In this example, the fourth AND gate 1120 disables refresh operations when the input signal db is zero. In this case, refresh operations are not needed since the pull-down NFET 736 is turned on and the pull-up PFET 738 is turned off when the input signal db is zero (i.e., low). When the input signal db goes high, the fourth AND gate 1120 enables refresh operations after the delay of the second delay circuit 1130. The delay helps ensure that the pull-up PFET 728 has enough time to pull up the output 706 of the transmitter 700 before refresh operations are enabled.

In certain aspects, refresh operations may be disabled in the non-boost mode since refresh operations are not needed in the non-boost mode. For example, the refresh circuit 910 may include an additional logic gate (e.g., AND gate) that enables the control circuit 340 to disable refresh operations in the non-boost mode.

In the above examples, the refresh circuit 910 outputs the negative pulses 1094 and 1096 to second input 924 of the logic gate 920 to cause the negative boost circuit 720 to perform refresh operations. This is because the first drive circuit 740 and the second drive circuit 742 are inverting in this example. However, it is to be appreciated that the present disclosure is not limited to this example. In implementations where the first drive circuit 740 and the second drive circuit 742 are non-inverting, the refresh circuit 910 may output positive pulses to the second input 924 of the logic gate 920 to cause the negative boost circuit 720 to perform refresh operations. In these implementations, the logic gate 920 may be implemented with an OR gate or another type of logic gate. Thus, in general, the refresh circuit 910 outputs pulses to the second input 924 of logic gate 920 to cause the negative boost circuit 720 to perform refresh operations, in which the pulses may be negative or positive depending on whether the drive circuits 740 and 742 are inverting or non-inverting drive circuits.

Implementation examples are described in the following numbered clauses:

1. A system, comprising:
    a driver including a pull-up p-type field effect transistor (PFET);
    a negative boost circuit comprising:
        a first drive circuit configured to receive a first supply voltage;
        a second drive circuit configured to receive a second supply voltage different from the first supply voltage;
        a switch coupled between an output of the second drive circuit and a gate of the pull-up PFET; and
        a capacitor having a first terminal and a second terminal, wherein the first terminal is coupled to the gate of the pull-up PFET and the second terminal is coupled to an output of the first drive circuit; and
    a pre-drive circuit configured to drive an input of the first drive circuit and an input of the second drive circuit based on an input signal.

2. The system of clause 1, wherein the switch comprises a PFET with a gate coupled to a ground.

3. The system of clause 1, wherein the switch comprises a first PFET and a second PFET coupled in series between the output of the second drive circuit and the gate of the pull-up PFET, a gate of the first PFET is coupled to a ground, and a gate of the second PFET is coupled to the ground.

4. The system of any one of clauses 1 to 3, wherein the switch is configured to turn on when the output of the second drive circuit is driven high, and turn off when the output of the second drive circuit is driven low.

5. The system of any one of clauses 1 to 4, wherein a source of the pull-up PFET is coupled to a supply rail, and a drain of the pull-up PFET is coupled to an output of the driver.

6. The system of clause 5, further comprising:
    a receiver; and
    a link coupled between the output of the driver and the receiver.

7. The system of clause 5 or 6, wherein the driver comprises a pull-down n-type field effect transistor (NFET), a drain of the pull-down NFET is coupled to the output of the driver, a gate of the pull-down NFET is coupled to the pre-drive circuit, and a source of the pull-down NFET is coupled to a ground.

8. The system of any one of clauses 1 to 7, further comprising:
    a logic gate having a first input, a second input, and an output, wherein the first input of the logic gate is coupled to the pre-drive circuit, and the output of the logic gate is coupled to the input of the first drive circuit and the input of the second drive circuit; and a refresh circuit coupled to the second input of the logic gate, wherein the refresh circuit is configured to output one or more pulses to the second input of the logic gate.

9. The system of clause 8, wherein:
the first drive circuit is configured to pull the output of the first drive circuit high in response to each one of the one or more pulses; and
the second drive circuit is configured to pull the output of the second drive circuit high in response to each one of the one or more pulses.

10. The system of clause 8 or 9, wherein:
each one of the one or more pulses is a negative pulse;
the first drive circuit comprises a first inverter; and
the second drive circuit comprises a second inverter.

11. The system of clause 10, wherein the logic gate comprises an AND gate.

12. The system of any one of clauses 8 to 11, wherein the refresh circuit is configured to receive a timing signal, and output each one of the one or more pulses on a respective rising edge or a respective falling edge of the timing signal.

13. The system of any one of clauses 1 to 12, wherein:
the first drive circuit comprises a first inverter; and
the second drive circuit comprises a second inverter.

14. The system of any one of clauses 1 to 13, wherein the first supply voltage is higher than the second supply voltage.

15. A system, comprising:
a driver including a pull-up p-type field effect transistor (PFET);
a negative boost circuit comprising:
a first drive circuit configured to receive a first supply voltage;
a second drive circuit configured to receive a second supply voltage different from the first supply voltage;
a third drive circuit configured to receive the second supply voltage;
a capacitor having a first terminal and a second terminal, wherein the first terminal is coupled to a gate of the pull-up PFET;
a first switch coupled between an output of the second drive circuit and the gate of the pull-up PFET;
a second switch coupled between an output of the first drive circuit and the second terminal of the capacitor; and
a third switch coupled between an output of the third drive circuit and the second terminal of the capacitor;
a pre-drive circuit configured to drive an input of the first drive circuit, an input of the second drive circuit, and an input of the third drive circuit based on an input signal.

16. The system of clause 15, wherein the first switch is configured to turn on when the output of the second drive circuit is driven high, and turn off when the output of the second drive circuit is driven low.

17. The system of clause 15 or 16, further comprising a control circuit configured to:
turn on the second switch and turn off the third switch if the first supply voltage is higher than the second supply voltage; and
turn off the second switch and turn on the third switch if the first supply voltage is lower than the second supply voltage.

18. The system of any one of clauses 15 to 17, further comprising:
a voltage generator configured to generate the first supply voltage and the second supply voltage; and a control circuit configured to adjust the first supply voltage and the second supply voltage generated by the voltage generator based on a frequency of the input signal.

19. The system of clause 18, further comprising a memory storing a voltage-frequency table, wherein the control circuit is configured to adjust the first supply voltage and the second supply voltage generated by the voltage generator based also on the voltage-frequency table.

20. The system of clause 18 or 19, wherein the control circuit is configured to:
turn on the second switch and turn off the third switch if the first supply voltage is higher than the second supply voltage; and
turn off the second switch and turn on the third switch if the first supply voltage is lower than the second supply voltage.

21. The system of any one of clauses 15 to 20, wherein the first switch comprises a PFET with a gate coupled to a ground.

22. The system of any one of clauses 15 to 20, wherein the first switch comprises a first PFET and a second PFET coupled in series between the output of the second drive circuit and the gate of the pull-up PFET, a gate of the first PFET is coupled to a ground, and a gate of the second PFET is coupled to the ground.

23. The system of any one of clauses 15 to 22, wherein a source of the pull-up PFET is coupled to a supply rail, and a drain of the pull-up PFET is coupled to an output of the driver.

24. The system of clause 23, further comprising:
a receiver; and
a link coupled between the output of the driver and the receiver.

25. The system of clause 23 or 24, wherein the driver comprises a pull-down n-type field effect transistor (NFET), a drain of the pull-down NFET is coupled to the output of the driver, a gate of the pull-down NFET is coupled to the pre-drive circuit, and a source of the pull-down NFET is coupled to a ground.

26. The system of any one of clauses 15 to 25, wherein:
the first drive circuit comprises a first inverter;
the second drive circuit comprises a second inverter; and
the third drive circuit comprises a third inverter.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 90 percent to 110 percent of the stated value.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a driver including a pull-up p-type field effect transistor (PFET);
a negative boost circuit comprising:
a first drive circuit configured to receive a first supply voltage;
a second drive circuit configured to receive a second supply voltage different from the first supply voltage;
a switch coupled between an output of the second drive circuit and a gate of the pull-up PFET, wherein the switch is configured to turn on when the output of the second drive circuit is driven high, and turn off when the output of the second drive circuit is driven low; and
a capacitor having a first terminal and a second terminal, wherein the first terminal is coupled to the gate of the pull-up PFET and the second terminal is coupled to an output of the first drive circuit; and
a pre-drive circuit configured to drive an input of the first drive circuit and an input of the second drive circuit based on an input signal.

2. A system, comprising:
a driver including a pull-up p-type field effect transistor (PFET);
a negative boost circuit comprising:
a first drive circuit configured to receive a first supply voltage;
a second drive circuit configured to receive a second supply voltage different from the first supply voltage;
a switch coupled between an output of the second drive circuit and a gate of the pull-up PFET, wherein the switch comprises a PFET with a gate coupled to a ground and a source coupled to the output of the second drive circuit; and
a capacitor having a first terminal and a second terminal, wherein the first terminal is coupled to the gate of the pull-up PFET and the second terminal is coupled to an output of the first drive circuit; and
a pre-drive circuit configured to drive an input of the first drive circuit and an input of the second drive circuit based on an input signal.

3. A system, comprising:
a driver including a pull-up p-type field effect transistor (PFET);
a negative boost circuit comprising:
a first drive circuit configured to receive a first supply voltage;
a second drive circuit configured to receive a second supply voltage different from the first supply voltage;
a switch coupled between an output of the second drive circuit and a gate of the pull-up PFET, wherein the switch comprises a first PFET and a second PFET coupled in series between the output of the second drive circuit and the gate of the pull-up PFET, a gate of the first PFET is coupled to a ground, and a gate of the second PFET is coupled to the ground; and
a capacitor having a first terminal and a second terminal, wherein the first terminal is coupled to the gate of the pull-up PFET and the second terminal is coupled to an output of the first drive circuit; and
a pre-drive circuit configured to drive an input of the first drive circuit and an input of the second drive circuit based on an input signal.

4. The system of claim 1, wherein a source of the pull-up PFET is coupled to a supply rail, and a drain of the pull-up PFET is coupled to an output of the driver.

5. The system of claim 4, further comprising:
a receiver; and
a link coupled between the output of the driver and the receiver.

6. The system of claim 4, wherein the driver comprises a pull-down n-type field effect transistor (NFET), a drain of the pull-down NFET is coupled to the output of the driver, a gate of the pull-down NFET is coupled to the pre-drive circuit, and a source of the pull-down NFET is coupled to a ground.

7. The system of claim 1, further comprising:
a logic gate having a first input, a second input, and an output, wherein the first input of the logic gate is coupled to the pre-drive circuit, and the output of the logic gate is coupled to the input of the first drive circuit and the input of the second drive circuit; and
a refresh circuit coupled to the second input of the logic gate, wherein the refresh circuit is configured to output one or more pulses to the second input of the logic gate.

8. The system of claim 7, wherein:
the first drive circuit is configured to pull the output of the first drive circuit high in response to each one of the one or more pulses; and
the second drive circuit is configured to pull the output of the second drive circuit high in response to each one of the one or more pulses.

9. The system of claim 7, wherein:
each one of the one or more pulses is a negative pulse;
the first drive circuit comprises a first inverter; and
the second drive circuit comprises a second inverter.

10. The system of claim 1, wherein:
the first drive circuit comprises a first inverter; and
the second drive circuit comprises a second inverter.

11. The system of claim 1, wherein the first supply voltage is higher than the second supply voltage.

12. A system, comprising:
a driver including a pull-up p-type field effect transistor (PFET);
a negative boost circuit comprising:
a first drive circuit configured to receive a first supply voltage;
a second drive circuit configured to receive a second supply voltage different from the first supply voltage;
a third drive circuit configured to receive the second supply voltage;
a capacitor having a first terminal and a second terminal, wherein the first terminal is coupled to a gate of the pull-up PFET;
a first switch coupled between an output of the second drive circuit and the gate of the pull-up PFET;
a second switch coupled between an output of the first drive circuit and the second terminal of the capacitor; and
a third switch coupled between an output of the third drive circuit and the second terminal of the capacitor; and
a pre-drive circuit configured to drive an input of the first drive circuit, an input of the second drive circuit, and an input of the third drive circuit based on an input signal.

13. The system of claim 12, wherein the first switch is configured to turn on when the output of the second drive circuit is driven high, and turn off when the output of the second drive circuit is driven low.

14. The system of claim 12, further comprising a control circuit configured to:
  turn on the second switch and turn off the third switch if the first supply voltage is higher than the second supply voltage; and
  turn off the second switch and turn on the third switch if the first supply voltage is lower than the second supply voltage.

15. The system of claim 12, further comprising:
  a voltage generator configured to generate the first supply voltage and the second supply voltage; and
  a control circuit configured to adjust the first supply voltage and the second supply voltage generated by the voltage generator based on a frequency of the input signal.

16. The system of claim 15, wherein the control circuit is configured to:
  turn on the second switch and turn off the third switch if the first supply voltage is higher than the second supply voltage; and
  turn off the second switch and turn on the third switch if the first supply voltage is lower than the second supply voltage.

17. The system of claim 12, wherein the first switch comprises a PFET with a gate coupled to a ground.

18. The system of claim 12, wherein the first switch comprises a first PFET and a second PFET coupled in series between the output of the second drive circuit and the gate of the pull-up PFET, a gate of the first PFET is coupled to a ground, and a gate of the second PFET is coupled to the ground.

19. The system of claim 12, wherein:
  the first drive circuit comprises a first inverter;
  the second drive circuit comprises a second inverter; and
  the third drive circuit comprises a third inverter.

20. The system of claim 2, wherein a source-to-gate voltage of the PFET is approximately equal to the second supply voltage when the output of the second driver circuit is driven high.

* * * * *